(12) United States Patent
Maekawa

(10) Patent No.: US 7,232,742 B1
(45) Date of Patent: Jun. 19, 2007

(54) METHOD OF MANUFACTURING A SEMICONDUCTOR DEVICE THAT INCLUDES FORMING A MATERIAL WITH A HIGH TENSILE STRESS IN CONTACT WITH A SEMICONDUCTOR FILM TO GETTER IMPURITIES FROM THE SEMICONDUCTOR FILM

(75) Inventor: Shinji Maekawa, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 8 days.

(21) Appl. No.: 09/724,403

(22) Filed: Nov. 27, 2000

(30) Foreign Application Priority Data

Nov. 26, 1999 (JP) .................................. 11-336850

(51) Int. Cl.
*H01L 21/477* (2006.01)
(52) U.S. Cl. ....................................... 438/476; 438/491
(58) Field of Classification Search ................ 438/164, 438/459, 753–755, 521, 960, 149, 151, 166, 438/479, 52, 476
See application file for complete search history.

(56) References Cited

U.S. PATENT DOCUMENTS

| 5,059,556 | A | * | 10/1991 | Wilcoxen ..................... 438/52 |
|---|---|---|---|---|
| 5,247,190 | A | | 9/1993 | Friend et al. |
| 5,399,502 | A | | 3/1995 | Friend et al. |
| 5,492,843 | A | | 2/1996 | Adachi et al. |
| 5,501,989 | A | | 3/1996 | Takayama et al. |
| 5,529,937 | A | | 6/1996 | Zhang et al. |
| 5,569,610 | A | | 10/1996 | Zhang et al. |
| 5,569,936 | A | | 10/1996 | Zhang et al. |
| 5,580,792 | A | | 12/1996 | Zhang et al. |
| 5,595,923 | A | | 1/1997 | Zhang et al. |
| 5,595,944 | A | | 1/1997 | Zhang et al. |
| 5,605,846 | A | | 2/1997 | Ohtani et al. |
| 5,606,179 | A | | 2/1997 | Yamazaki et al. |
| 5,612,250 | A | | 3/1997 | Ohtani et al. |
| 5,621,224 | A | | 4/1997 | Yamazaki et al. |
| 5,637,515 | A | | 6/1997 | Takemura |
| 5,639,698 | A | | 6/1997 | Yamazaki et al. |
| 5,646,424 | A | | 7/1997 | Zhang et al. |

(Continued)

FOREIGN PATENT DOCUMENTS

JP 6-338507 * 12/1994

(Continued)

OTHER PUBLICATIONS

Schenk et al., "Polymers for Light Emitting Diodes," EuroDisplay '99: Proceedings of the 19th International Display Research Conference, Sep. 6-9, 1999, pp. 33-37.

*Primary Examiner*—Stephen W. Smoot
(74) *Attorney, Agent, or Firm*—Fish & Richardson P.C.

(57) ABSTRACT

In a method of crystallizing a semiconductor film by introducing a metallic element that promotes crystallization, a gettering thereafter is effectively performed. A material film having a high tensile stress, typically a silicon nitride film, is formed in contact with the semiconductor film or heated after the formation thereof, thereby the metallic element in a crystalline semiconductor film is gettered to the material film having a high tensile stress. Thus, the metallic Interstitial silicon density element is removed or reduced to thereby form a gettered region.

29 Claims, 27 Drawing Sheets

U.S. PATENT DOCUMENTS

| | | | |
|---|---|---|---|
| 5,654,203 A | 8/1997 | Ohtani et al. | |
| 5,663,077 A | 9/1997 | Adachi et al. | |
| 5,670,411 A * | 9/1997 | Yonehara et al. | 438/459 |
| 5,677,549 A | 10/1997 | Takayama et al. | |
| 5,700,333 A | 12/1997 | Yamazaki et al. | |
| 5,734,195 A * | 3/1998 | Takizawa et al. | 257/607 |
| 5,744,822 A | 4/1998 | Takayama et al. | |
| 5,744,824 A | 4/1998 | Kousai et al. | |
| 5,773,327 A | 6/1998 | Yamazaki et al. | |
| 5,773,846 A | 6/1998 | Zhang et al. | |
| 5,783,468 A | 7/1998 | Zhang et al. | |
| 5,837,619 A | 11/1998 | Adachi et al. | |
| 5,874,348 A | 2/1999 | Takizawa et al. | |
| 5,879,977 A | 3/1999 | Zhang et al. | |
| 5,882,960 A | 3/1999 | Zhang et al. | |
| 5,897,347 A | 4/1999 | Yamazaki et al. | |
| 5,904,770 A | 5/1999 | Ohtani et al. | |
| 5,923,962 A | 7/1999 | Ohtani et al. | |
| 5,929,464 A | 7/1999 | Yamazaki et al. | |
| 5,942,768 A | 8/1999 | Zhang | |
| 5,956,579 A | 9/1999 | Yamazaki et al. | |
| 5,961,743 A | 10/1999 | Yamazaki et al. | |
| 5,966,594 A | 10/1999 | Adachi et al. | |
| 5,970,366 A * | 10/1999 | Okonogi | 438/471 |
| 5,985,704 A | 11/1999 | Adachi et al. | |
| 6,060,725 A | 5/2000 | Zhang et al. | |
| 6,071,764 A | 6/2000 | Zhang et al. | |
| 6,074,901 A | 6/2000 | Ohtani et al. | |
| 6,077,758 A | 6/2000 | Zhang et al. | |
| 6,090,646 A | 7/2000 | Zhang et al. | |
| 6,133,075 A | 10/2000 | Yamazaki et al. | |
| 6,140,165 A * | 10/2000 | Zhang et al. | 438/166 |
| 6,140,213 A | 10/2000 | Takizawa et al. | |
| 6,444,390 B1 * | 9/2002 | Yamazaki et al. | 430/166 |
| 6,693,044 B1 * | 2/2004 | Yamazaki et al. | 438/745 |
| 7,026,197 B2 * | 4/2006 | Nakajima et al. | 438/153 |

FOREIGN PATENT DOCUMENTS

| | | | |
|---|---|---|---|
| JP | 6338507 | * | 12/1994 |
| JP | 7-201842 | * | 8/1995 |
| JP | 08-78329 | | 3/1996 |
| JP | 09-312260 | | 12/1997 |
| JP | 10-092576 | | 4/1998 |
| JP | 10-247735 | | 9/1998 |
| JP | 10-270363 | | 10/1998 |
| JP | 11031824 A | * | 2/1999 |
| WO | WO90-013148 | | 11/1990 |

* cited by examiner

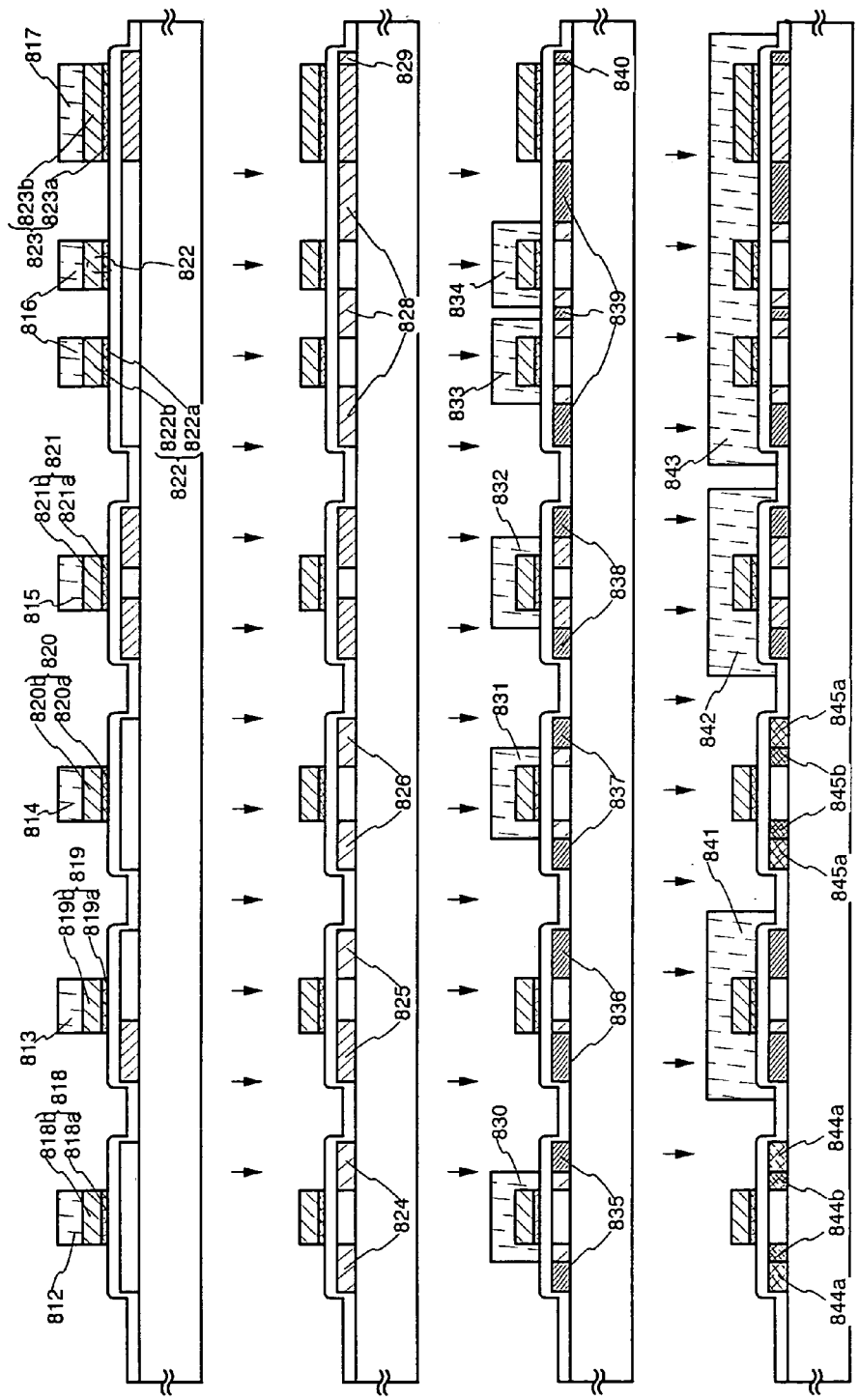

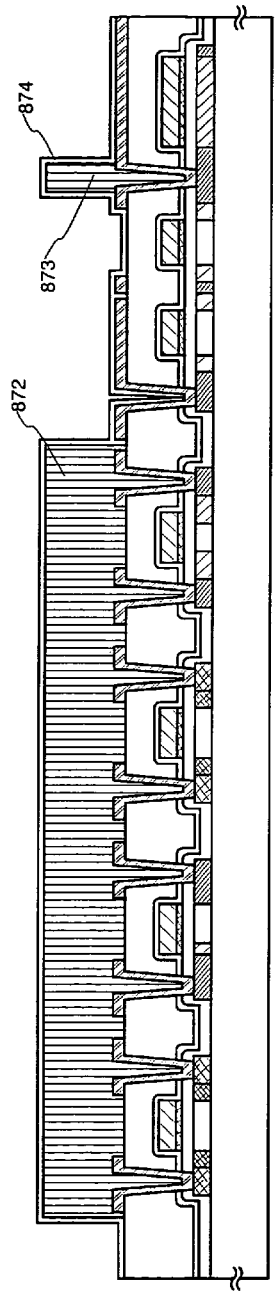
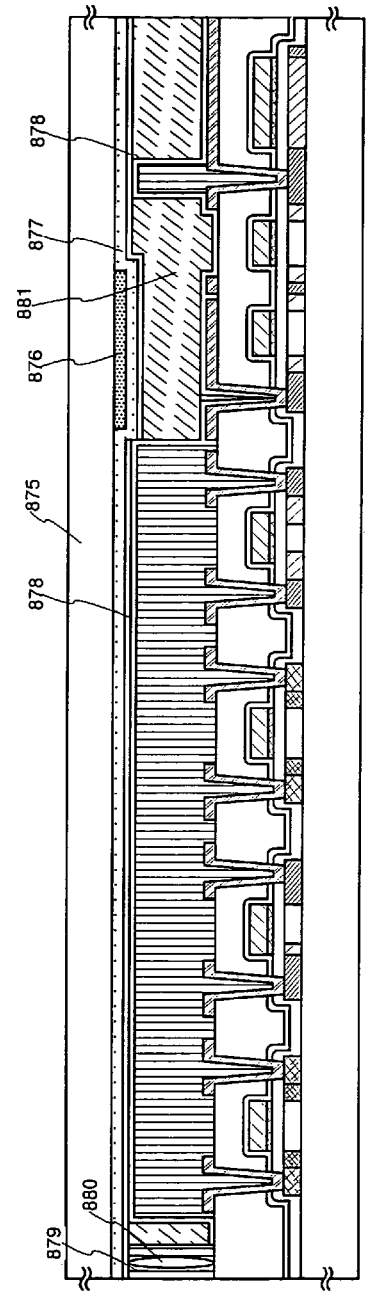
Fig.12A
Fig.12B

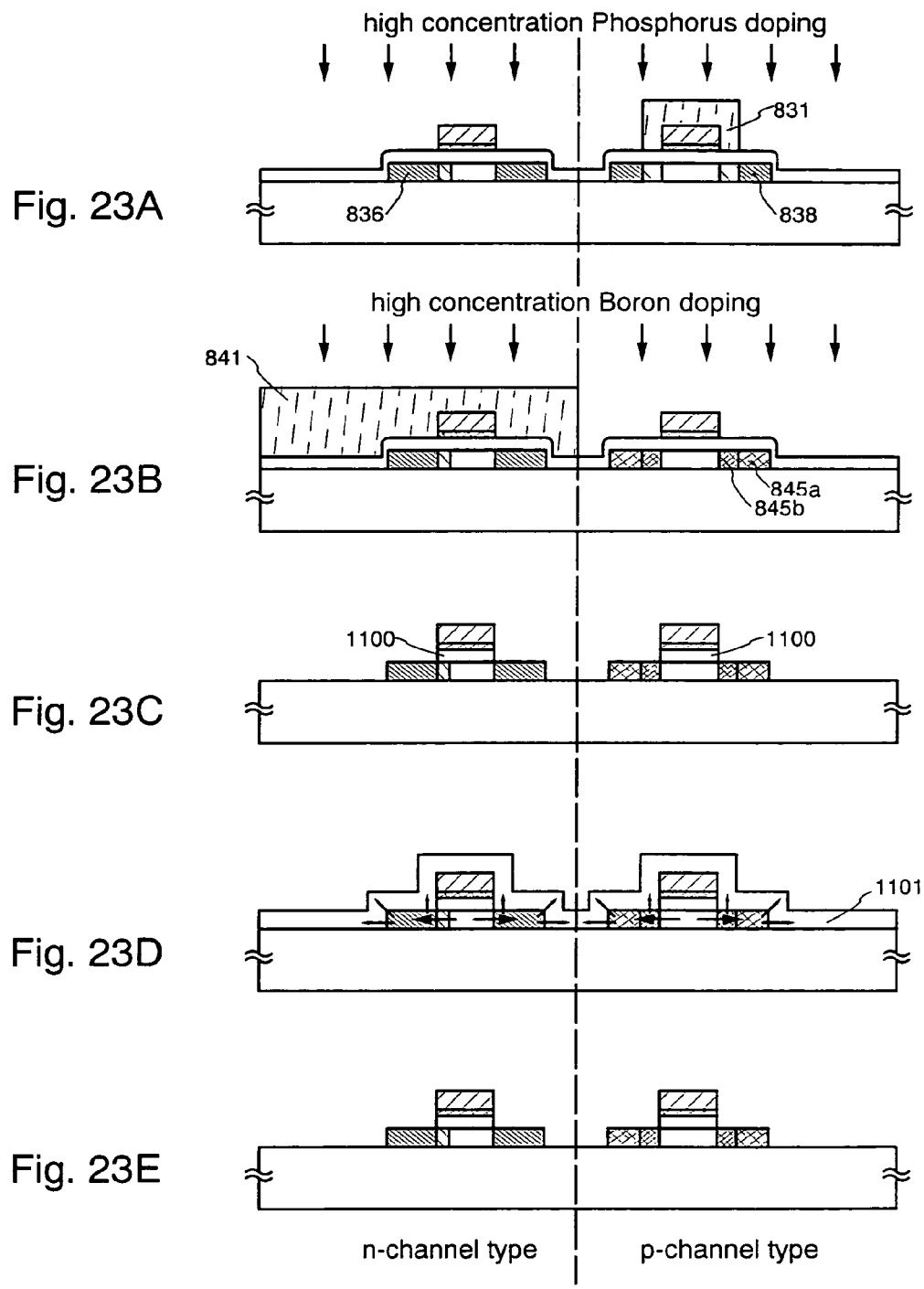

METHOD OF MANUFACTURING A SEMICONDUCTOR DEVICE THAT INCLUDES FORMING A MATERIAL WITH A HIGH TENSILE STRESS IN CONTACT WITH A SEMICONDUCTOR FILM TO GETTER IMPURITIES FROM THE SEMICONDUCTOR FILM

BACKGROUND OF THE INVENTION

1. Field of the Invention

The present invention relates to a method of manufacturing a crystalline semiconductor film formed on a substrate, and more particularly to a semiconductor device having a circuit constructed of a thin film transistor (hereinafter referred to as TFT) that uses the crystalline semiconductor film as an active layer and a method of manufacturing the same. For example, the present invention relates to an electro-optical device typified by a liquid crystal display panel and to electronic equipment having such an electro-optical device mounted thereon as a part.

It is to be noted that a semiconductor device as stated herein throughout the present specification denotes a general device which functions by utilizing semiconductor characteristics, and that electro-optical devices, semiconductor circuits, and electronic equipments are all semiconductor devices.

2. Description of the Related Art

In a method of manufacturing a semiconductor device employing a semiconductor substrate such as a silicon wafer, impurities such as heavy metallic elements are introduced into the substrate through a process contamination whereby the semiconductor device deteriorates and results in a reduction in yield. Therefore, an ultra-clean-technology has been proposed as a technique to remove these impurities from the source and its utility as an impurity remover has been proven. On the other hand, in a semiconductor process technique, a gettering technique for eliminating and capturing the impurities from an active region of the device is relatively inexpensive, and hence has procured sound achievements in the improvement of yield.

Conventional gettering techniques are roughly and conveniently divided into three methods: (1) Extrinsic Gettering: EG method, (2) Intrinsic Gettering: IG method, and (3) Chemical Gettering: CG method.

The extrinsic gettering (EG) method is a gettering technique for supplying a gettering sink to the back surface of the wafer by way of the extrinsic means. Therefore, the EG method is also called a backside gettering. The gettering sink in the EG method is imparted to the back surface of the wafer by the extrinsic means (a mechanical damage typified by a sand blasting which uses the polishing powder of $SiO_2$ or the like, a high concentration diffusion of phosphorus, CVD growth of an $Si_3N_4$ film or a polysilicon film, etc.).

A distorted region, a stress region, a defect region, or a chemically active region formed on the back surface of the wafer operates as the gettering sink, which is due to the above-mentioned extrinsic means, to capture the impurities that have diffused to a distance which corresponds to a thickness from the front surface of the wafer. Thus, the gettering sink must be provided in the back surface of the wafer before the initial oxidation process. One of the drawbacks of the EG method is that the process employing the EG method itself may introduce new impurities into the front surface of the wafer. However, the EG method, which inflicts mechanical damages to the back surface of the wafer, is widely and generally used in the manufacturing of devices for reasons of its simplicity and low cost.

The intrinsic gettering (IG) method is a gettering technique which utilizes a bulk defect that is induced in the silicon wafer by heat treatment. That is, the IG method is also called an internal gettering because it employs a sink in the wafer.

Further, the chemical gettering (CG) method is a gettering technique which forms metal chlorides susceptible to evaporation by performing heat treatment under an atmosphere containing chloric gas to thereby remove contaminants from the front surface of the wafer. Dissimilar from the above EG method and IG method, the CG method does not supply a gettering sink. Note that the frequency of use of the CG method, compared with that of the EG method or the IG method, is not much.

Many have acknowledged that characteristics of semiconductor devices are enhanced by employing the above-mentioned gettering techniques, and hence the EG method which is suitable as a mass production technique is being actively adopted and developments for a more superior gettering techniques and simpler and easier methods have been examined as well. Although the IG effect was discovered and there was an academic rise in the interest in the gettering techniques, and even a model of a gettering phenomenon was proposed, industrial applications preceded all these. The mechanism of a gettering in which physical constants and chemical constants such as an individual saturation, a diffusion coefficient, a level of solid solution, and a segregation coefficient of the impurities formed of heavy metal elements in the silicon crystal are taken into consideration has been made clear only recently.

A technique for structuring a thin film transistor (TFT) using a semiconductor thin film (having a thickness on the order of about several to several hundred nm) formed on a substrate having an insulating surface has been attracting much attention in recent years. Thin film transistors are widely applied to electronic devices such as an IC or an electro-optical device, and in particular, development of the TFT as a switching element of an image display device is proceeding rapidly.

Conventionally, an amorphous silicon film was used in the formation of the TFT. However, attempts have been made in manufacturing the TFT by utilizing a crystalline silicon film (also referred to as a polycrystal silicon film or a polysilicon film) in order to attain a higher performance.

A technique as one of the techniques for obtaining the crystalline silicon film on a glass substrate is disclosed in Japanese Patent Application Laid-open No. Hei 8-78329. The technique disclosed in this application is one in which a metallic element for promoting crystallization to the amorphous silicon film is selectively doped, and then heat treatment is carried out to thereby form the crystalline silicon film spreading from a doped region as the starting point.

This technique is a technique in which the metallic element (such as Ni) for promoting crystallization to the amorphous silicon film is selectively doped, and then heat treatment is conducted to thereby form the crystalline silicon film spreading from the doped region as the starting point. Further, due to an action of the metallic element in this technique, a lowering of the crystallization temperature of the amorphous silicon film by approximately between 50 to 100° C. of is possible compared with the case where the metallic element to promote crystallization is not used. Thus, the time necessary for performing crystallization in this technique can also be reduced to between one fifth and one tenth compared with the case where the metallic element to promote crystallization is not used.

Despite having excellent merits in lowering the temperature and shortening the time of the crystallization process, in this technique, the metallic element (such as Ni) used in promoting crystallization forms deep levels in the silicon film to trap carriers, and hence there is concern that this will exert a bad influence on the reliability and electric characteristic of the TFT. Therefore, similar to the method of manufacturing the semiconductor device employing the above-mentioned semiconductor substrate, after crystallizing the silicon film, it is preferable that either gettering is performed to swiftly remove the metallic element or the metallic element is reduced to a level where the electric characteristic of the TFT is not influenced.

As one of the gettering methods of the metallic element (Ni), a gettering process was conceived. That is, in this gettering process, after the metallic element is doped into the amorphous silicon film formed on an insulating surface, phosphorus (P) is doped into a portion of the crystalline silicon film which was formed by performing heat treatment. Then, Ni is gettered from a region serving as the active layer of the TFT by performing heat treatment.

However, because a dosage of $2\times10^{15}$ (atoms/cm$^3$) of phosphorus is doped into the amorphous silicon film in the above gettering process, there is an extremely high possibility of bringing about a new problem in that a chemical contamination is generated inside the clean room. In addition, a phosphorus contamination in the furnace, which occurs when a substrate doped with phosphorus is placed in a furnace, also becomes a problem. In practice, a considerably high concentration of phosphorus has been detected not only in the vicinity of the doping device but also in other areas in the clean room. Phosphorus is deemed as one of the major causes of making the controlling of a threshold value of the TFT difficult.

SUMMARY OF THE INVENTION

In order to solve the above problems, many experiments and examinations were conducted from various aspects, thereby leading to the discovery of an extremely effective method capable of removing or reducing a metallic element remaining in a crystalline silicon film. The resultant of this discovery is thus the present invention.

According to a first aspect of the present invention, there is provided a method of manufacturing a semiconductor device, characterized in that a material having a tensile stress that is equivalent to or greater than a predetermined value is formed in contact with a semiconductor that is formed on a substrate, whereby an impurity element in the semiconductor is gettered into the material. Note that if the tensile stress of the material is $8\times10^9$ dynes/cm$^2$ or more, preferably $9.5\times10^9$ dynes/cm$^2$ or more, then the impurity element in the semiconductor can be very effectively removed or reduced.

Further, by forming the material through LPCVD within a temperature range of between 500° C. to 900° C., within a pressure range of between 0.1 and 3 Torr, and with a gas containing chlorine as a material gas, then the impurity element in the semiconductor can be very effectively removed or reduced.

Still further, in the case that the material is a silicon nitride film formed by LPCVD, then the material particularly has a gettering effect. In addition, it is preferable that a composition ratio of N/Si in the silicon nitride film is between 1.2 and 1.4.

According to a second aspect of the present invention, there is provided a method of manufacturing a semiconductor device, characterized in that a material formed by LPCVD within a temperature range of between 500° C. and 900° C. is formed in contact with a semiconductor that is formed on a substrate, whereby an impurity element in the semiconductor is gettered into the material. Therefore, the impurity element in the semiconductor can be very effectively removed or reduced.

According to a third aspect of the present invention, there is provided a method of manufacturing a semiconductor device, characterized in that a material formed by LPCVD within a pressure range of between 0.1 and 3 Torr is formed in contact with a semiconductor that is formed on a substrate, whereby an impurity element in the semiconductor is gettered into the material. Therefore, the impurity element in the semiconductor can be very effectively removed or reduced.

According to a fourth aspect of the present invention, there is provided a method of manufacturing a semiconductor device, characterized in that a material formed by LPCVD with a gas containing chlorine as a material gas is formed in contact with a semiconductor that is formed on a substrate, whereby an impurity element in the semiconductor is gettered into the material. Therefore, the impurity element in the semiconductor can be very effectively removed or reduced.

According to a fifth aspect of the present invention, there is provided a method of manufacturing a semiconductor device, characterized in that a silicon nitride film having an N/Si composition ratio of between 1.2 and 1.4 is formed in contact with a semiconductor that is formed on a substrate, whereby an impurity element in the semiconductor is gettered into the silicon nitride film. Therefore, the impurity element in the semiconductor can be very effectively removed or reduced.

According to a sixth aspect of the present invention, there is provided a method of manufacturing a semiconductor device, characterized in that a silicon nitride film formed by LPCVD is formed in contact with a semiconductor that is formed on a substrate, whereby an impurity element in the semiconductor is gettered into the silicon nitride film. Therefore, the impurity element in the semiconductor can be very effectively removed or reduced.

Further, by forming the silicon nitride film through LPCVD within a temperature range of between 500° C. to 900° C., within a pressure range of between 0.1 and 3 Torr, and with a gas containing chlorine as a material gas, then the impurity element in the semiconductor can be very effectively removed or reduced.

Still further, in the case that the composition ratio of N/Si in the silicon nitride film is between 1.2 and 1.4, then the silicon nitride film particularly has a gettering effect.

It is to be noted that the impurity element in the above-mentioned semiconductor mainly denotes a metallic element, that is, an element selected from the group consisting of: nickel, iron, cobalt, ruthenium, rhodium, palladium, osmium, iridium, platinum, copper, and gold.

Furthermore, the semiconductor is a non-single crystal semiconductor film formed on a substrate or the like, and the present invention is effective when the semiconductor is particularly a crystalline silicon film.

It is to be noted that the gas containing chlorine indicates a mixture gas that contains any one of $SiCl_4$, $SiH_2Cl_2$, $SiCl_3$, and $Si_2Cl_6$.

According to a seventh aspect of the present invention, there is provided a method of manufacturing a semiconductor device, characterized in that after a material is formed in contact with a semiconductor that is formed on a substrate, heat treatment is performed to thereby raise a tensile stress of the material to $8 \times 10^9$ dynes/cm$^2$ or more and at the same time the impurity element in the semiconductor is gettered into the material.

Further, by carrying out the heat treatment at a temperature of 500° C. to 1100° C., under a pressure of 0.1 to 10 Torr, and under an inert gas atmosphere, the impurity element in the semiconductor can be very effectively removed or reduced. The removal and reduction of the impurity element is particularly effective in the case that nitrogen is used as the inert gas.

In the case that the material is a silicon nitride film, a silicon nitride oxide film, or a laminate film thereof all formed by plasma CVD or sputtering, then the material especially has a gettering effect.

Furthermore, the method of manufacturing a semiconductor device according to the present invention is characterized in that the composition ratio of N/Si in the silicon nitride film prior to the heat treatment is between 0.8 and 1.4.

Still further, the method of manufacturing a semiconductor device according to the present invention is characterized in that the composition ratio of N/Si in the silicon nitride film after the heat treatment is between 1.2 and 1.4.

According to an eighth aspect of the present invention, there is provided a method of manufacturing a semiconductor device, characterized in that after a material is formed in contact with a semiconductor that is formed on a substrate, heat treatment is performed to thereby set a composition ratio of N/Si of the material to between 1.2 and 1.4 and at the same time an impurity element in the semiconductor is gettered into the material. Therefore, the impurity element in the semiconductor can be very effectively removed or reduced. It is to be noted that the material is a silicon nitride film, a silicon nitride oxide film, or a laminate film thereof.

According to a ninth aspect of the present invention, there is provided a method of manufacturing a semiconductor device, characterized by comprising the steps of: intentionally introducing a metallic element for promoting crystallization of silicon into an amorphous semiconductor film; crystallizing the amorphous semiconductor film by performing a first heat treatment to thereby obtain a crystalline semiconductor film; and forming a silicon nitride film in contact with the crystalline semiconductor film after formation thereof and at the same time gettering the metallic element to the silicon nitride film, whereby the metallic element in the crystalline semiconductor film is removed or reduced. Therefore, the metallic element in the semiconductor film can be very effectively removed or reduced.

According to a tenth aspect of the present invention, there is provided a method of manufacturing a semiconductor device, characterized by comprising the steps of: selectively introducing a metallic element for promoting crystallization of silicon into an amorphous semiconductor film; crystallizing the amorphous semiconductor film by performing a first heat treatment to thereby obtain a crystalline semiconductor film; and forming a silicon nitride film in contact with the crystalline semiconductor film after formation thereof and at the same time gettering the metallic element to the silicon nitride film, whereby the metallic element in the crystalline semiconductor film is removed or reduced. Therefore, the metallic element in the semiconductor film can be very effectively removed or reduced.

Further, the method of manufacturing a semiconductor device according to the ninth and tenth aspects of the present invention is characterized in that the silicon nitride film is formed by LPCVD.

Still further, the method of manufacturing a semiconductor device according to the ninth and tenth aspects of the present invention is characterized in that after the formation of the silicon nitride film, the silicon nitride film is removed, whereby the metallic element in the semiconductor film can be very effectively removed or reduced.

According to an eleventh aspect of the present invention, there is provided a method of manufacturing a semiconductor device, characterized by comprising the steps of: intentionally introducing a metallic element for promoting crystallization of silicon into an amorphous semiconductor film; crystallizing the amorphous semiconductor film by performing a first heat treatment to thereby obtain a crystalline semiconductor film; forming a silicon nitride film in contact with the crystalline semiconductor film after formation thereof; and performing a second heat treatment to thereby getter the metallic element to the silicon nitride film, whereby the metallic element in the crystalline semiconductor film is removed or reduced. Therefore, the metallic element in the semiconductor film can be very effectively removed or reduced.

According to a twelfth aspect of the present invention, there is provided a method of manufacturing a semiconductor device, characterized by comprising the steps of: selectively introducing a metallic element for promoting crystallization of silicon into an amorphous semiconductor film; crystallizing the amorphous semiconductor film by performing a first heat treatment to thereby obtain a crystalline semiconductor film; forming a silicon nitride film in contact with the crystalline semiconductor film after formation thereof; and performing a second heat treatment to thereby getter the metallic element to the silicon nitride film, whereby the metallic element in the crystalline semiconductor film is removed or reduced. Therefore, the metallic element in the semiconductor film can be very effectively removed or reduced.

According to a thirteenth aspect of the present invention, there is provided a method of manufacturing a semiconductor device, characterized by comprising the steps of: intentionally introducing a metallic element for promoting crystallization of silicon into an amorphous semiconductor film; crystallizing the amorphous semiconductor film by performing a first heat treatment to thereby obtain a crystalline semiconductor film; forming a silicon oxide film having an opening portion and in contact with the crystalline semiconductor film after formation thereof; forming a silicon nitride film in contact with the opening portion; performing a second heat treatment to thereby getter the metallic element to the silicon nitride film, whereby the metallic element in the crystalline semiconductor film is removed or reduced; and patterning the crystalline semiconductor film with the silicon oxide film as a mask. Therefore, the metallic element in the semiconductor film can be very effectively removed or reduced.

According to a fourteenth aspect of the present invention, there is provided a method of manufacturing a semiconductor device, characterized by comprising the steps of: forming a silicon oxide film having an opening portion and in contact with an amorphous semiconductor film; selectively introducing a metallic element for promoting crystallization of silicon to the amorphous semiconductor film with the silicon oxide film as a mask; crystallizing the amorphous semiconductor film by performing a first heat treatment to thereby obtain a crystalline semiconductor film; forming a silicon nitride film in contact with the opening portion; performing a second heat treatment to thereby getter the metallic element to the silicon nitride film, whereby the metallic element in the crystalline semiconductor film is removed or reduced; and patterning the crystalline semiconductor film with the silicon oxide film as a mask.

Further, in the method of manufacturing a semiconductor device according to any one of the eleventh to fourteenth aspects of the present invention, it is preferable that the silicon nitride film is removed after performing the second heat treatment.

Still further, in the method of manufacturing a semiconductor device according to any one of the eleventh to fourteenth aspects of the present invention, it is important that the second heat treatment sets a tensile stress of the silicon nitride film to $8 \times 10^9$ dynes/cm$^2$ or more, preferably to $9.5 \times 10^9$ dynes/cm$^2$ or more.

Note that the term "plasma CVD" as stated throughout the present specification is a method in the chemical vapor deposition method which utilizes plasma that is generated by applying a high electric field to a gas maintained at a certain low pressure, to thereby deposit a solid material due to a chemical reaction in the vapor-phase.

In the chemical vapor deposition method, "LPCVD" is a method performed under a setting where a pressure of gas inside a reaction container is reduced to be lower than an atmospheric pressure. By reducing the pressure of gas, a film having good covering properties can thus be uniformly formed.

It is known that thin films formed by known film deposition techniques such as CVD (chemical vapor deposition) and sputtering have internal stress. Included in the internal stress are an intrinsic stress and a thermal stress which originates in the difference of a thermal expansion coefficient between a thin film and a substrate.

Taking into consideration the quality of the substrate and the process temperature, the influence derived from the thermal stress can be ignored. However, the generating mechanism of the intrinsic stress is not clear, but rather it is perceived that the intrinsic stress is generated by the occurrence of a phase change and a composition change in a complicated manner due to film deposition process and heat treatment thereafter of a film.

Generally, there are two internal stresses, the tensile stress and the compressive stress. As shown in FIG. 18A, when a thin film 401 is trying to contract with respect to a substrate 402, the substrate 402 pulls in a direction impeding this contraction, and hence deformation occurs with the thin film on the inside. This is called the tensile stress. On the other hand, as shown in FIG. 18B, when the thin film 401 is trying to expand, the substrate 402 is pressed and compressed, and hence deformation occurs with the thin film 401 on the outside. Thus, this is called the compressive stress.

BRIEF DESCRIPTION OF THE DRAWINGS

The above and other objects and features of the present invention will be more apparent from the following description taken in conjunction with the accompanying drawings:

FIGS. 10A to 10D are diagrams showing manufacturing processes of an AM-LCD;

FIGS. 12A and 12B are views showing a cross-sectional structure of an active matrix type liquid crystal display device;

FIGS. 23A to 23E are diagrams showing manufacturing processes of a TFT in accordance with a thirteenth embodiment of the present invention;

DETAILED DESCRIPTION OF THE PREFERRED EMBODIMENTS

Hereinafter, an embodiment mode of the present invention will be described.

The present invention will provide a method of obtaining a semiconductor in which impurity elements are either removed or reduced by gettering the impurity elements (such as metallic elements) contained in the semiconductor formed on a substrate to a material (an $Si_xN_y$ film and an $Si_xN_yO_z$ film typified by SiN, $Si_2N_3$, etc.) that has a tensile stress of $8 \times 10^9$ dynes/cm² or more, preferably $9.5 \times 10^9$ dynes/cm² or more.

There is also known a method, as one of the conventional EG methods, in which an $Si_3N_4$ film is formed on a back surface of a wafer and then gettering is performed. However, the present invention greatly differs in the point that impurity elements are gettered to a material (provided that a value of the tensile stress of the material is equivalent to or greater than a predetermined value) formed in contact with the semiconductor on the substrate. Particularly, the present invention is an effective technique for the case where metallic elements are gettered from a crystalline silicon, film to which crystallinity has been improved by using a metallic element for promoting crystallization of silicon.

Figure 1A:
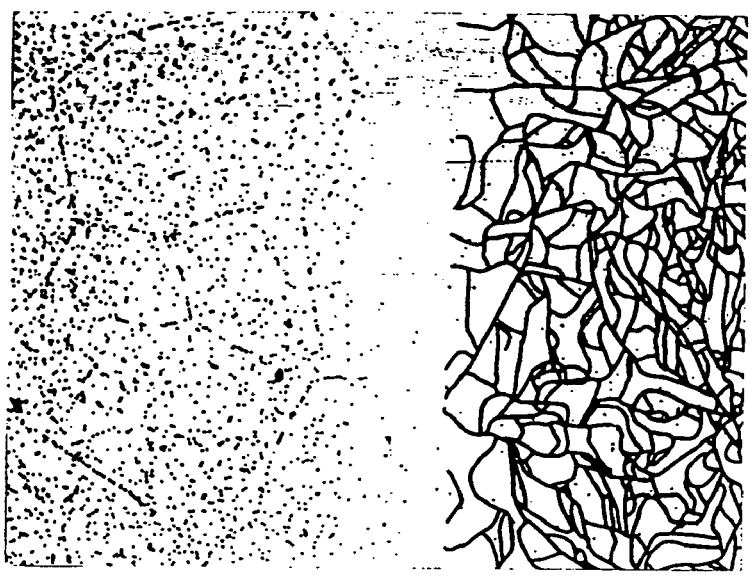
FIG. 1A is a photomicrograph showing a gettering effect of the present invention and FIG. 1B is a schematic view thereof.

Heat treatment (at a temperature of 600° C. to 900° C. for 1 to 12 hours) is performed on a silicon nitride film having a high tensile stress ($9.5 \times 10^9$ dynes/cm²) formed by LPCVD or on a silicon nitride film formed by plasma CVD, to thereby increase the tensile stress. The silicon nitride film to which its tensile stress ($1 \times 10^{10}$ dynes/cm²) has been increased is formed into a laminate layer on the semiconductor film (crystalline silicon film) and then the capturing ability of the impurity elements (here, it is nickel) in the semiconductor film is examined. Through the result of this examination, it is then discerned that the silicon nitride film has a gettering effect, thus leading to the development of this present invention. FIG. 1A is a photomicrograph (photograph taken with an optical microscope and enlarged at a magnification of 50 times) showing the gettering effect obtained by the present invention.

The experiment on examining the existence or non-existence of the gettering effect attained by the present invention is shown in the following.

Figure 2A:
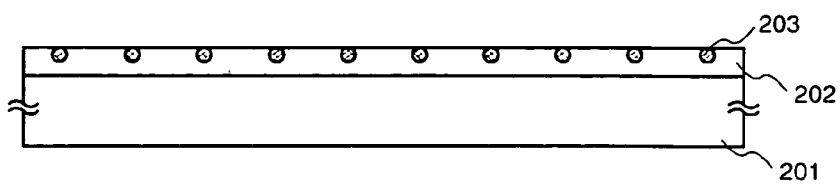
FIGS. 2A to 2E are diagrams illustrating experimental processes for confirming the existence or non-existence of the gettering effect.

First, after forming an amorphous silicon film on a quartz substrate 201, a metallic element (here it is nickel) for promoting the crystallization of silicon is introduced into the entire surface of the amorphous silicon film. Then the first heat treatment (at a temperature of 400° C. to 1050° C. for 1 to 24 hours) is performed to thereby crystallize the amorphous silicon film. In this state, a large amount of $NiSi_x$ 203, as the reaction formations of nickel and silicon, are contained in a crystalline silicon film 202. (See FIG. 2A)

Figure 2B:
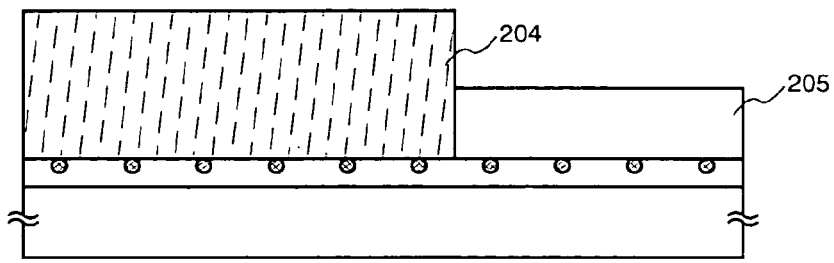

A plural number of quartz blocks (2 to 3 cm×2 to 3 cm) 204 are next placed on the crystalline silicon film obtained through crystallization. (See FIG. 2B)

Figure 2C:
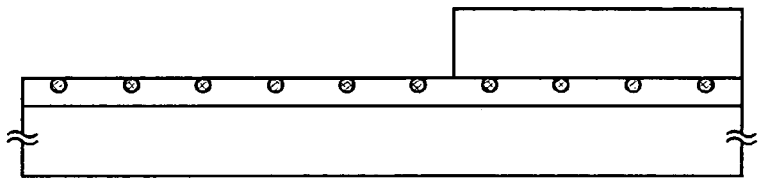

Thereafter, under the condition in which the quartz blocks 204 are set, plasma CVD (conditions 1 to 9) or LPCVD (conditions 10, 11) is conducted to thereby form a silicon nitride film 205. A semiconductor region is intentionally formed not contacting the silicon nitride film. The quartz blocks 204 are then removed. Thus, a semiconductor region that is in contact with the silicon nitride film and a semiconductor region that is not in contact therewith are formed by utilizing the quartz blocks. (See FIG. 2C)

Figure 2D:
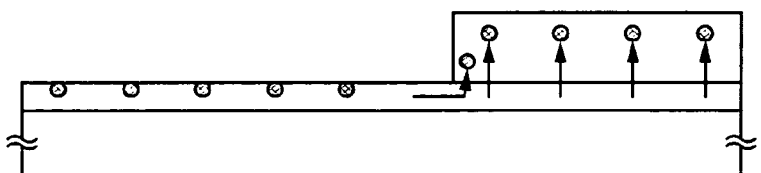

The substrate having the semiconductor region in contact with the silicon nitride film and the semiconductor region not in contact therewith formed in interminglement thereon is subjected to a second heat treatment (conditions 2, 3, 5, 6, 8, 9, and 11). The stress of the silicon nitride film is increased by this second heat treatment. Further, experiments were also conducted with the conditions (conditions 1, 5, 7, and 10) not including the second heat treatment. (See FIG. 2D)

Next, removal of the $NiSi_x$ is carried out in order to examine if there is a gettering effect or not. To be more specific, after the substrate is immersed in an FPM solution for 30 minutes, it is immersed in a mixed solution (manufactured by Stella Chemifa Co., product name LAL500) containing 7.13% of ammonium bifluoride ($NH_4HF_2$) and 15.4% of ammonium fluoride ($NH_4F$). Then the substrate is cleaned with running water. (See FIG. 2E) Note that though most of the LAL500 is removed at the same time with the silicon nitride film, traces (crack-like pattern) will remain in the semiconductor region that is not in contact with the silicon nitride film. The silicon nitride film may be removed by heated phosphoric acid (85% or more molarity, manufactured by Wakou Junyaku Industry) or the like before being etched by the LAL500. However, phosphorus was intentionally used here for the purpose of making clear the position of the semiconductor region that is in contact with the silicon nitride film.

Thereafter, the substrate is observed under the optical microscope. In the region where Ni is not gettered, a hole (about 0.7 to 1 μm in diameter) formed when the $NiSi_x$ 203 is eliminated by the FPM solution and the LAL500 solution can be observed.

In accordance with the above experiment method, an experiment was conducted by changing the film deposition method (plasma CVD or LPCVD) and the conditions of the second heat treatment. The results of this experiment observed under the optical microscope are shown in Table 1.

Table 1

The photograph shown in FIG. 1A is that of condition 3. Further, FIG. 1A is a photographic view observed from the top of FIG. 2E, FIG. 1B is schematic view of FIG. 1A, and FIG. 4 is an enlarged photographic view thereof.

Figure 14:
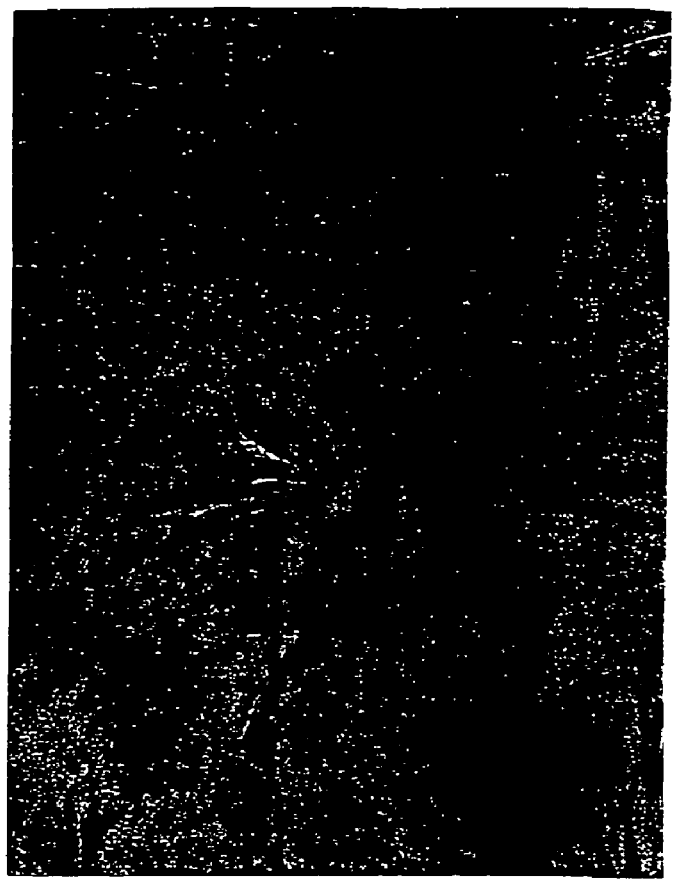
FIG. 14 is a view of a photomicrograph showing a gettering effect of the present invention.

Shown in FIG. 14 is a photograph of the case where heated phosphorus or the like is used to remove the silicon nitride film before being etched by the LAL500 so that traces (crack-like pattern) will not remain in the semiconductor region that is in contact with the silicon nitride film.

Figure 1B:
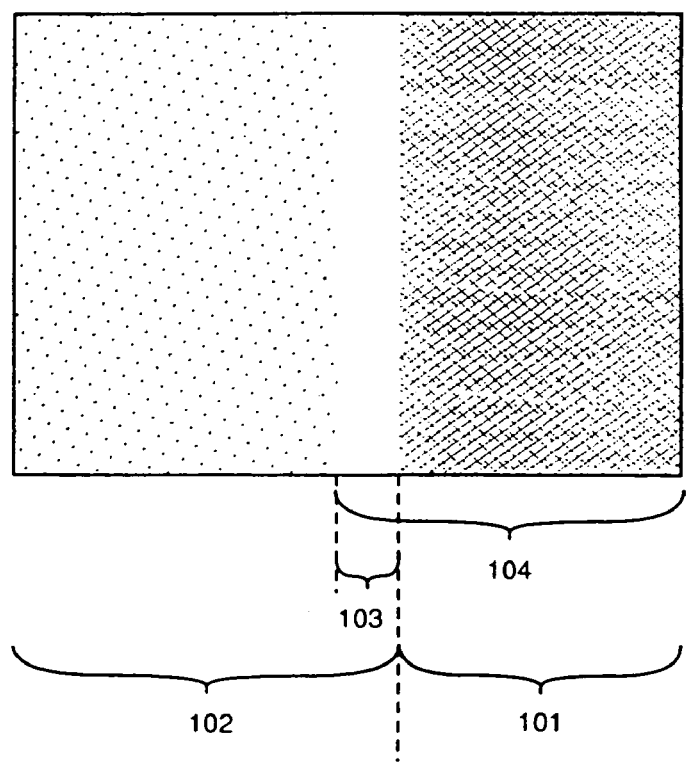
Figure 2E:
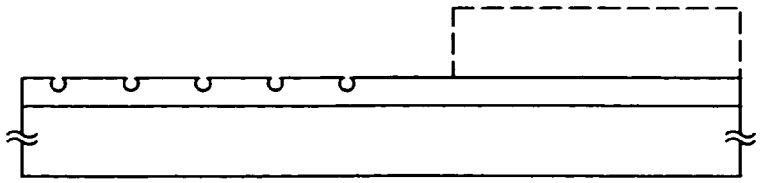
Figure 4:
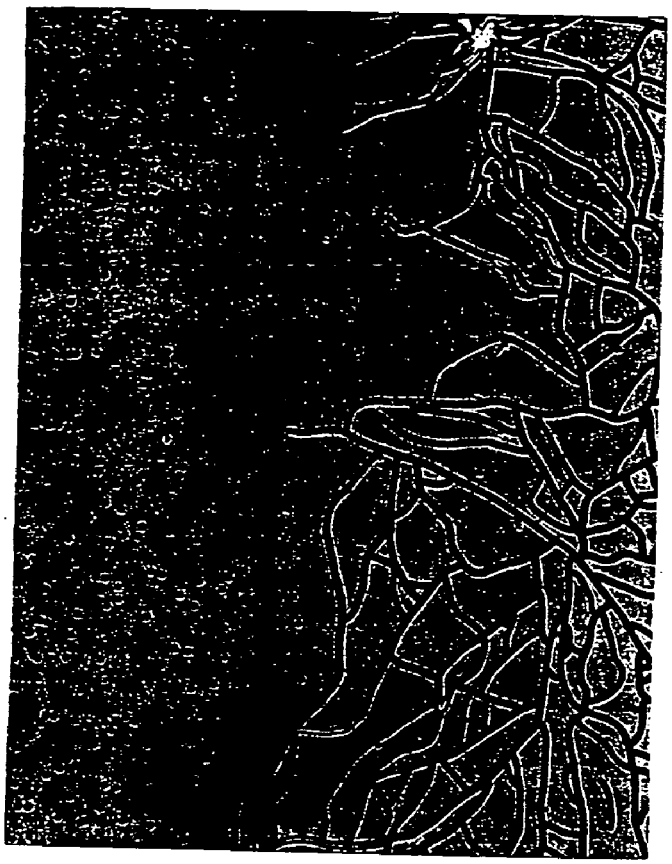
FIG. 4 is a view of a photomicrograph showing a gettering effect of the present invention.

As is apparent from FIGS. 1A, 1B, and 4, there are almost no $NiSi_x$ holes in the semiconductor region 101 in contact with the silicon nitride film. Accordingly, in the semiconductor region 101 in contact with the silicon nitride film, Ni is sucked out in a perpendicular direction to the substrate by the tensile stress of the silicon nitride film. That is, the effect of Ni being gettered in the lengthwise direction can be confirmed.

On the other hand, a large number of $NiSi_x$ holes can be seen in the semiconductor region 102 that is not in contact with the silicon nitride film because of the presence of the quartz blocks. However, even in the semiconductor region 102 not in contact with the silicon nitride film, similar to the semiconductor region 101 in contact with the silicon nitride film, the number of holes are not many in a boundary portion (a region from the boundary having a width of about 200 μm) 103 with the semiconductor region 101 in contact with the silicon nitride film. Therefore, in the boundary portion 103, Ni is sucked out by the tensile stress of the silicon nitride film in a direction parallel with the substrate surface.

In other words, the effect of Ni being gettered in the horizontal direction can be confirmed.

Accordingly, a region 104 in which $NiSi_X$ is finally gettered is a combined region of the boundary portion 103 and the semiconductor region 101 in contact with the silicon nitride film.

In a sample (conditions 2, 5, 6, 8, 9) formed by plasma CVD and subjected to the second heat treatment, a state similar to the one shown in FIG. 1A can be observed.

Further, in another sample (conditions 2, 5, 8) formed by plasma CVD and subjected to the second heat treatment at a temperature of 600° C., $NiSi_X$ holes are concentrated in a direction toward the boundary of the semiconductor region 101 in contact with the silicon nitride film and the semiconductor region 102 not in contact with the silicon nitride film. This can be perceived as an effect in which the entirely dispersed Ni is pulled to a region near the silicon nitride film.

In another sample (conditions 3, 6, 9) subjected to the second heat treatment at a temperature of 950° C., there can be seen a tendency of the $NiSi_X$ holes to gather in one local area that is nearer to the silicon nitride film than that of the sample (conditions 2, 5, 8) subjected to the second heat treatment at a temperature of 600° C. Further, compared with the 600° C. sample, a portion of the interface where there are no $NiSi_X$ holes, that is, an area outside the region where the holes have gathered, can be seen more distinctively in the 950° C. sample. Thus, it can be perceived from these results that the higher the temperature of the second heat treatment is, the bigger the effect of gettering Ni. It is deemed that the occurrence of this phenomenon is due to the tensile stress of the silicon nitride film increasing with the rise of the temperature.

Alternatively, in a silicon nitride film (conditions 1, 5, 7) formed by plasma CVD but not subjected to heat treatment, the distribution of the holes of $NiSi_X$ is almost uniform. Hence, from this fact, it is perceived that Ni was not gettered.

From the results of the above experiments (samples), confirmation was made in the point that the second heat treatment, which is carried out to increase the tensile stress of the silicon nitride film (range of film thickness between 150 nm to 470 nm) formed by plasma CVD, had the effect of removing or reducing the metallic elements (gettering effect).

It is to be noted that the silicon nitride film formed by plasma CVD (PCVD apparatus) and used in the above experiment is a film formed under the following film deposition conditions: film deposition temperature at 325° C., film deposition pressure at 0.7 Torr, film deposition speed at 50 nm/min, and the film deposition gases (flow rate) of $SiH_4/NH_3/N_2$=5 sccm/38 sccm/87 sccm. The uniformity inside the surface of the silicon nitride film after its formation is ±2%.

The tensile stress of the silicon nitride film (film thickness 200 nm) right after its formation by plasma CVD was $5 \times 10^9$ (dynes/cm$^2$). Further, the tensile stress of the silicon nitride film after being subjected to the second heat treatment at 600° C. was $1.05 \times 10^{10}$ (dynes/cm$^2$), and the tensile stress thereof after the second heat treatment at 950° C. was $1.56 \times 10^{10}$ (dynes/cm$^2$) or more.

Figure 3:
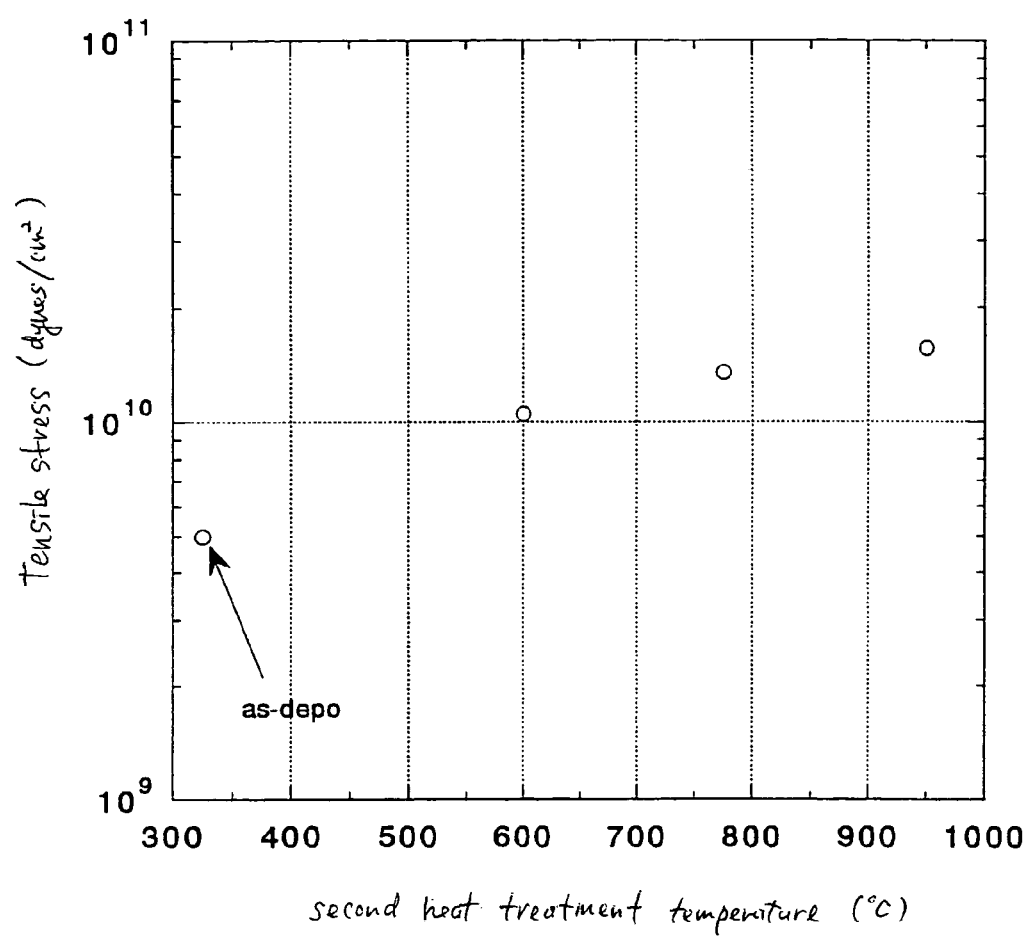
FIG. 3 is a diagram showing a relationship between a stress of a silicon nitride film formed by plasma CVD and a temperature of a heat treatment.

FIG. 3 is a diagram showing the relationship between the second heat treatment temperature and the tensile stress.

Also, in regards to the silicon nitride film formed by LPCVD, that is, the condition 10 in which heat treatment is not conducted and the condition 11 in which heat treatment is conducted, the same results as that of the above conditions (2, 3, 5, 6, 8, 9) were obtained in both of the conditions. The cause of this is believed that the silicon nitride film is formed by LPCVD at a high temperature (775° C.) and that the tensile stress of the film right after the formation is $8 \times 10^9$ (dynes/cm$^2$) or more.

It is to be noted that the silicon nitride film formed by LPCVD (LPCVD apparatus) and used in the above experiment is a film formed under the following film deposition conditions: film deposition temperature at 775° C., film deposition pressure at 0.3 Torr, film deposition speed at 4 nm/min, and the film deposition gases of $NH_3/SiH_2Cl_2$=240 sccm/80 sccm. The uniformity inside the surface of the silicon nitride film after its formation is ±1.5%. In addition, the tensile stress of the silicon nitride film (film thickness 200 nm) right after its formation was $9.57 \times 10^9$ (dynes/cm$^2$).

Therefore, confirmation was made in that the process of forming the silicon nitride film by LPCVD had the effect of being able to remove or reduce metallic elements (gettering effect).

In order to obtain the gettering effect with utilization of the silicon nitride film formed by plasma CVD or LPCVD, it is important that the tensile stress of the silicon nitride film is set to $8 \times 10^9$ (dynes/cm$^2$) or more, preferably $9.5 \times 10^9$ (dynes/cm$^2$) or more, and that the silicon nitride film is formed to a film thickness of 100 nm or more, preferably 150 nm or more. The improvement of the gettering ability was also confirmed as the film thickness of the silicon nitride film was increased. It can be said that this is because the micro defects in the surface have been reduced.

Studies concerning the various gettering mechanisms of the present invention will be described hereinafter.

When a value of the tensile stress of the material in contact with the semiconductor exceeds $8 \times 10^9$ (dynes/cm$^2$), preferably $9.5 \times 10^9$ (dynes/cm$^2$), a gettering sink is supplied. The gettering sink due to the tensile stress is a dislocation and lamination defect. This is a gettering mechanism which utilizes the tensile stress.

Further, the gettering sink supplied in the silicon nitride film is basically the dislocation and lamination defect. Furthermore, the silicon nitride film itself becomes the sink for capturing the metallic elements. The silicon nitride film formed by plasma CVD or LPCVD has not become a complete stoichiometry $Si_3N_4$, and lacks Si atoms. For example, the composition ratio of N/Si in the silicon nitride film of the present invention is 0.8 to 1.4, preferably 1.2 to 1.4. Therefore, excessive interstitial silicon atoms form the stoichiometry $Si_3N_4$, and as a result, diffuse toward the $Si/Si_3N_4$ film interface. In short, an $I_{Si}$ density (Interstitial silicon density) that is the source of the surface micro lamination defect is consequently reduced. This is a gettering mechanism that utilizes the composition ratio of N/Si in the silicon nitride film.

The effect of the gettering utilizing the composition ratio of N/Si in the silicon nitride film depends on the film thickness thereof. It is deemed this is because that accompanying the increase of the film thickness, the surface micro defect declines at a film thickness of 250 nm or more.

Note that when the gettering mechanism utilizing the composition ratio of the silicon nitride film is employed in addition to the gettering mechanism that utilizes the tensile stress, then a multiplier effect can be attained, which is effective.

The relative size of a coupling energy and a thermal energy of the metallic elements and the silicon nitride film serving as a gettering site due to a segregation induced gettering is important in the above gettering mechanism.

Both the coupling energy and the thermal energy combine at the gettering site, and hence the segregation of the metallic elements advances.

The silicon nitride film that employed the LPCVD method uses a mixed gas of $NH_3$ and $SiH_2Cl_2$ as the material gas. The chlorine contained in the mixed gas fulfills the role of promoting the diffusion of nitrides and the nitrating reaction at the interface (silicon nitride film/semiconductor film). Additionally, in the initial stage of film deposition, chlorine is coupled with the metallic elements and transformed into gas by the chemical gettering that utilizes the chlorine contained in the material gas, thereby reducing the metallic elements. After the initial stage of the film deposition, the gettering mechanism which utilizes the chlorine changes with the increase of the film thickness. Accordingly, the above-mentioned gettering mechanisms that utilize the tensile stress and the composition ratio of the silicon nitride film become predominant.

A typical embodiment mode of the present invention will be described based on the above experiments and studies.

In Embodiment Mode 1, first, a metallic element for promoting crystallization of silicon is introduced into the front surface of an amorphous semiconductor film that has been formed on a substrate in advance. Then a crystalline semiconductor film is formed by utilizing the metallic element. Next, a material having a tensile stress is formed entirely or partially in contact with the crystalline semiconductor film. Heat treatment is implemented to thereby increase the stress value of the tensile stress of the material. Thus, the metallic element is transferred or gettered to the material having the tensile stress, whereby the concentration of the metallic element in the crystalline semiconductor film is reduced or removed.

Further, in another embodiment mode (Embodiment Mode 2), first, the metallic element for promoting crystallization of silicon is introduced into the front surface of the amorphous semiconductor film that has been formed on the substrate in advance. Then the crystalline semiconductor film is formed by utilizing the metallic element. Next, a material (typically a silicon nitride film formed by LPCVD) having a high tensile stress is formed entirely or partially in contact with the crystalline semiconductor film to thereby transfer or getter the metallic element to the material having the tensile stress. As a result, the concentration of the metallic element in the crystalline semiconductor film is reduced or removed.

The formation of the amorphous semiconductor film in Embodiment Modes 1 and 2 can be performed by plasma CVD, LPCVD, sputtering, and other appropriate film deposition techniques. The amorphous semiconductor film is formed on a surface that has a suitable insulating surface. There is no limitation placed on the substrate, and therefore besides a glass substrate and a quartz substrate, a ceramic substrate and other types of substrates are employed.

Further, other than nickel, one element or plural kinds of elements selected from the group consisting of: iron, cobalt, ruthenium, rhodium, palladium, osmium, iridium, platinum, copper, and gold can be used as the metallic element in Embodiment Modes 1 and 2. In addition, the introduction method of the metallic element into the amorphous semiconductor film is not particularly limited provided that it is a method that will attain the existence of the metallic element in the surface or the interior of the amorphous semiconductor film. For example, sputtering, CVD, plasma CVD, adsorption, and application of a metalline solution can be used.

Still further, in Embodiment Modes 1 and 2, the metallic element (here it is nickel) for promoting crystallization of silicon is introduced into the entire amorphous semiconductor film or partial thereof after the amorphous semiconductor film is formed on the substrate. Then the amorphous semiconductor film is crystallized by means of heat treatment. Note that this heat treatment is referred to as "the first heat treatment" throughout the present specification. In addition, crystallization may be carried out by irradiation of a powerful light such as a laser beam, an ultraviolet light, or an infrared light instead of the heat treatment, or the irradiation of the powerful light such as laser beam, ultraviolet light, or infrared light may be carried out after the heat treatment. The merit of introducing the metallic element for promoting crystallization of silicon into the entire amorphous semiconductor film is that the number of processes is smaller. On the other hand, in case of introducing the metallic element for promoting crystallization of silicon into a portion of the amorphous silicon film to which a mask or the like has been formed thereon, the merit thereof is that the amount of metallic element to be introduced can be set to the minimum amount necessary for crystallization. In addition, the mask formed for the purpose of introducing the metallic element into a portion of the amorphous semiconductor film can be used as a mask utilized in a later process, for example, the patterning of the crystalline semiconductor film, and hence the number of processes may be reduced.

Though the above crystallization is proceeded under an atmosphere containing hydrogen and oxygen, it is preferable that crystallization is performed under an atmosphere containing inert gas such as nitrogen and argon. In case of employing the first heat treatment as the crystallization method, the first heat treatment can be performed at a temperature range of 400 to 1050° C. However, crystallization takes a long time because the speed thereof is slow at 400° C., and thus 550° C. or more is preferable. It is to be noted that in case of using a glass substrate, there is a limit of 600 to 650° C. in relation to a distortion point, and that there is a limit of 980 to 1050° C. in case of using a quartz substrate.

In Embodiment Mode 1 and Embodiment Mode 2, an $Si_XN_Y$ film and an $Si_XN_YO_Z$ film (provided that X<<Y, Z<<Y, to be more specific, a concentration ratio of N to a concentration of Si in the film is between 0.3 to 1.6, and a concentration ratio of O to the concentration of Si in the film is between 0.1 to 0.8) typified by SiN, $Si_2N_3$, $Si_3N_4$, etc. can be used as the material having the tensile stress. However, from the viewpoints of an etching ratio with the crystalline semiconductor film and the influence of the impurity elements diffusion to the crystalline semiconductor film, it is most preferred that the silicon nitride film ($Si_XN_Y$ film) is used.

Further, in Embodiment Mode 1, although heat treatment is performed after forming the film (material that has tensile stress) in contact with the obtained crystalline semiconductor film, the metallic element in the film is gettered at this point due to the action of the stress. Note that the heat treatment performed here is referred to as "the second heat treatment" throughout the present specification. The tensile stress of the material having tensile stress is raised to $8\times10^9$ (dynes/cm$^2$) or more, preferably $9.5\times10^9$ (dynes/cm$^2$) or more by the second heat treatment. The case where the heating temperature of the second heat treatment is higher than the temperature applied for crystallization (temperature of the first heat treatment) is preferable because the crystallinity of the crystalline semiconductor film will be enhanced.

In Embodiment 2, only the formation of the film (material that has tensile stress) in contact with the obtained crystalline semiconductor film is performed to getter the metallic element in the film. It is considered that this is because the metallic element in the film is gettered at the same time the film is formed since the stress value of the material that has tensile stress is high at $8\times10^9$ (dynes/cm$^2$) or more, preferably $9.5\times10^9$ (dynes/cm$^2$) or more and a film deposition temperature is high. Note that preferably the film deposition temperature of the material having tensile stress is higher than the temperature applied for 600° C. crystallization (temperature of the first heat treatment).

The material having tensile stress may be formed contacting the entire surface of the obtained crystalline semiconductor film, or may be formed selectively contacting a portion thereof. As a means of selectively forming the material in contact with a portion of the crystalline semiconductor film, quartz blocks may be used, or after forming an SiO$_2$ film (silicon oxide film) on the crystalline semiconductor film, patterning is implemented on the SiO$_2$ film to form a mask, whereby a region where the material having tensile stress is not formed thereon may be intentionally formed. In case of selectively forming the material in contact with a portion of the crystalline semiconductor film, though the number of processes is increased compared with the case of forming in contact with the entire surface thereof, a region that will serve as a channel forming region of a TFT later can be protected by this mask, which is effective. In addition, the mask formed for the purpose of selectively forming the material having tensile stress in contact with a portion of the crystalline semiconductor film can be used as a mask utilized in a later process, for example, the patterning of the crystalline semiconductor film, and hence the number of processes may be reduced. In addition, the mask formed for the purpose of introducing the metallic element to a portion of the amorphous semiconductor film may be used, as it is, as the mask for selectively forming the material having tensile stress in contact with a portion of the crystalline semiconductor film. The material having tensile stress may also be formed contacting the entire surface or a portion of the crystalline semiconductor film after it has been patterned.

The film in which metallic elements have been gettered therein contains a great amount of metall elements, and therefore the removal of the material having tensile stress is preferred. During the process of removing the material having tensile stress, there is a fear that the surface of the region which will later be the surface of the channel forming region of the TFT is contaminated. Therefore, it is preferable that the material having tensile stress is formed after protecting this region with a mask made of silicon oxide film, and furthermore may be used as a portion of a gate insulating film.

The gettering method of the present application may be appropriately combined with other known gettering methods, for example, the gettering method which utilizes thermal oxidation under an oxidic atmosphere containing halogen elements (Japanese Patent Application Laid-open No. Hei 9-312260) and the gettering method by doped phosphorus (Japanese Patent Application Laid-open Nos. Hei 10-247735 and Hei 10-270363) to thereby further reduce the metallic elements.

Moreover, as the amorphous semiconductor film in Embodiment Mode 1 and Embodiment Mode 2, an amorphous semiconductor film and a microcrystalline semiconductor film may be used. It is possible to further use a compound semiconductor film that has an amorphous structure such as an amorphous silicon film.

Though shown in Embodiment Mode 1 and Embodiment Mode 2 is the example applied to a top gate type TFT using a crystalline semiconductor film on a substrate, the structure of the TFT is not particularly limited. The present invention may also be applied to, for example, a bottom gate type TFT.

A detailed description regarding the present invention adopting the above structure will be made with embodiments shown in the following.

Embodiment 1

The process of fabricating a crystalline silicon film that is patterned into an island shape with utilization of the present invention will be explained. It is to be noted that nickel is used as the metallic element for promoting crystallization of silicon. Embodiment 1 is shown in the following with reference to FIGS. 5A to 6D.

An amorphous silicon film 502 is first formed on a quartz substrate 501 to a thickness of 53 nm by utilizing LPCVD. The present invention is not limited to the amorphous silicon film, but other films may be used as long as the film is an amorphous semiconductor film. For example, a compound semiconductor film containing an amorphous structure such as a microcrystalline semiconductor film and an amorphous silicon germanium film may be used.

The LPCVD method is employed because the quality of a film formed by this method is densified, and therefore the crystalline silicon film obtained after crystallization in a later process has excellent film quality. Note that by performing film deposition with the LPCVD apparatus, the amorphous silicon film 502 is formed on both surfaces of the substrate 501. Plasma CVD and sputtering can be used as film deposition methods other than LPCVD.

In case of using the glass substrate instead of the quartz substrate as the substrate, it is preferable to form an insulating film containing silicon, for example, a silicon oxide film, a silicon nitride oxide film, and a silicon nitride film in advance before forming the amorphous silicon film to thereby use the insulating film as a base film for blocking impurities from the substrate.

Next, in order to improve a moisture characteristic, a thin oxidized film of ozone water is formed on the surface of the amorphous silicon film before it is applied with a nickel acetate aqueous solution.

A nickel element is then introduced to the amorphous silicon film by using the aqueous solution of nickel acetate. The nickel acetate aqueous solution here containing 5 ppm (weight conversion) of nickel is dripped to thereby form a thin layer 503 containing nickel by spin coating. (See FIG. 5A) Further, in Embodiment 1, a spin coater not shown in the drawing is employed to spin coat the nickel acetate aqueous solution at a rotation number of 150 rpm. After maintaining this rotation number for 40 seconds, the nickel acetate aqueous solution is shaken off at 2000 rpm and dried. As other methods of introducing the nickel element to the amorphous silicon film, there are methods such as sputtering, CVD, and plasma CVD. However, the most preferred method is the method using the solution since regulating the concentration of the metallic element is comparatively easy.

Thereafter, the first heat treatment is conducted in a nitrogen atmosphere at a temperature of between 550° C. to 600° C. for 15 hours. Then crystallization of the amorphous silicon film is performed to thereby obtain a crystalline silicon film 504. (See FIG. 5B) Because the amorphous silicon film is crystallized with the nickel element introduced into the entire surface thereof, crystals grow radially from the indefinite number of centers. The crystallization method used in Embodiment 1 is referred to as a lateral growth method. Further, there is also a depth growth method in which the nickel element is intentionally introduced to a portion of the amorphous silicon film and crystallization is performed thereafter (to be more specific, this is a method in which a mask insulating film made of a silicon oxide film is formed on the amorphous silicon film, then after patterning, an opening portion is provided in the region where the metallic element will be doped later, and then thermal crystallization is performed after adding the metallic element solution). However, the lateral growth method is preferable because the process becomes complicated and the number of masks are increased in the depth growth method when compared thereto.

After crystallizing the amorphous silicon film, a silicon film 505 formed on the back surface of the substrate by LPCVD is removed. In Embodiment 1, the entire surface of the crystalline silicon film 504 formed on the front surface of the substrate is applied with a resist, and the amorphous silicon film on the back surface of the substrate is removed by a dry etching apparatus ($SF_6$/He=20/20, 300 W). Thereafter, exfoliation of the resist formed on the side of the front surface is carried out.

A mask insulating film 506 made of a silicon oxide film is next formed on the crystallized crystalline silicon film 504 to a film thickness of 150 nm at a temperature of 400° C. by employing LPCVD. (See FIG. 5C) As another method besides LPCVD, plasma CVD can be used.

Next, after applying a resist on the entire surface of the mask insulating film 506, patterning is performed to thereby form a resist mask 507. (See FIG. 5D)

Then using the resist mask 507, a portion of the silicon oxide film serving as the mask is removed by using the LAL500 solution. An opening portion 500 is formed in a mask 508 made of a silicon oxide film. The crystalline silicon film 504 is exposed in the region where the opening portion 500 is formed. It is to be noted that the shape and size of the opening portion may be arbitrarily determined by an implementor. During this process, the silicon oxide film formed on the side of the back surface of the substrate is also removed. Thereafter, the exfoliation of the resist mask 507 is carried out by using a resist exfoliation liquid. (See FIG. 5E)

Made of the silicon oxide film, the mask 508 formed by the resist mask is a mask for exposing a portion of the crystalline silicon film 504 in order to carry out gettering of the present invention, and at the same time it is also a mask used for shaping the crystallized silicon film into an island shape in a later process. Furthermore, the mask 508 has an effect in protecting the crystalline silicon film 504 which will later serve as the channel forming region of the TFT. Thus, by forming the patterning mask for performing gettering and the pattering mask of the crystalline silicon film into the same mask, the process can be simplified and the number of masks can be reduced.

Subsequently, in order to remove or reduce the metallic elements (mainly nickel elements) from the crystalline silicon film 504 which will be utilized as an active layer of the TFT, a silicon nitride film 509 is formed by LPCVD to a thickness of 100 nm or more, preferably between 150 nm and 400 nm. In Embodiment 1, the silicon nitride film 509 is formed to a film thickness of 300 nm in contact with the crystalline silicon film through the opening portion 500. (See FIG. 6A)

Typical material gases in case of forming the silicon nitride film by LPCVD are cited as follows and any one from these may be used:

(1) a mixed gas of $SiH_2Cl_2$ and $NH_3$ (film deposition temperature 700° C. or more);
(2) a mixed gas of $SiH_2Cl_2$, $NH_3$ and $H_2$ (film deposition temperature 700° C. or more);
(3) a mixed gas of $SiCl_4$, $NH_3$ and $H_2$ (film deposition temperature 900° C. or more);
(4) a mixed gas of $SiH_4$, $NH_3$ and $H_2$ (film deposition temperature 600° C. or more);
(5) a mixed gas of $SiH_4$ and $NH_3$ (film deposition temperature 600° C. or more);
(6) a mixed gas of $SiCl_3$, $NH_3$ and $H_2$;
(7) a mixed gas of $Si_2Cl_6$, $NH_3$ and $H_2$;
(8) a mixed gas of $Si(CH_3)_4$ and $NH_3$; and
(9) a mixed gas of $SiCl_4$, $N_2H_4$ and $H_2$ (film deposition temperature 800° C. or more).

In Embodiment 1, the silicon nitride film is formed under the following film deposition conditions: film deposition temperature at 775° C., film deposition pressure at 0.3 Torr, film deposition speed at 4 nm/min, and the film deposition gases used are $NH_3$/$SiH_2Cl_2$=240 sccm/80 sccm. The uniformity inside the surface of the silicon nitride film after its formation is ±1.5%. At this point, simultaneous with the formation of the silicon nitride film 509, the metallic elements are transferred in the direction indicated by an arrow in FIG. 6A and gettered to the silicon nitride film. As mentioned in Embodiment Mode, the silicon nitride film 509 formed by the LPCVD apparatus at a film deposition temperature of about 775° C. is thus high, and the tensile stress of the silicon nitride film right after its formation exceeds $8 \times 10^9$ (dynes/$cm^2$). Therefore, the metallic elements can be removed from the crystalline silicon film 504 without the need to perform a treatment such as the heat treatment for increasing stress. To roughly classify this gettering mechanism, it falls under the segregation induced gettering.

Next, the metallic elements are gettered and then the silicon nitride film 509 containing nickle elements at a high concentration is removed. Though there is no particular limit placed on the method of removing the silicon nitride film 509, as a method thereof in Embodiment 1, a phosphoric acid solution (85% or more molarity, manufactured by Wakou Junyaku Industry) as an etchant is used. The phosphoric acid solution is heated on a hot plate at 100 to 150° C. to thereby remove the silicon nitride film 509. Because the silicon nitride film 509 and the oxidized insulating film 508 have a selective ratio of 55/2 to the heated phosphoric acid solution, and the silicon nitride film 509 and the crystalline silicon film 504 have a selective ratio of 55/1 to the heated phosphoric acid solution, it is possible to remove only the silicon nitride film 509. Similarly, in dry etching, the silicon nitride film and the oxidized insulating film have a selective ratio and the silicon nitride film and the crystalline silicon film have a selective ratio, and therefore dry etching may also be used. (See FIG. 6B)

Using the mask 508 made of the silicon oxide film, etching is performed next to thereby obtain an island-like crystalline silicon film 510. (See FIG. 6C) Drying etching (reaction gas: $CF_4$/$O_2$=50/45, over 20 seconds) is used in Embodiment 1.

Next, the mask 508 that is made of the silicon oxide film is removed by using the LAL500 solution. (See FIG. 6D)

Accordingly, after the metallic elements for promoting crystallization of silicon are introduced to the amorphous silicon film, the amorphous silicon film is crystallized to thereby obtain the crystalline silicon film. The silicon nitride film is then formed selectively in contact with the obtained crystalline silicon film, whereby the metallic elements in the crystalline silicon film are gettered.

Embodiment 2

Shown in Embodiment 2 is an example of performing gettering by using the silicon nitride film formed by a film deposition method that is different from the one in Embodiment 1. This example is illustrated in FIGS. 7A to 7E.

Figure 5A:
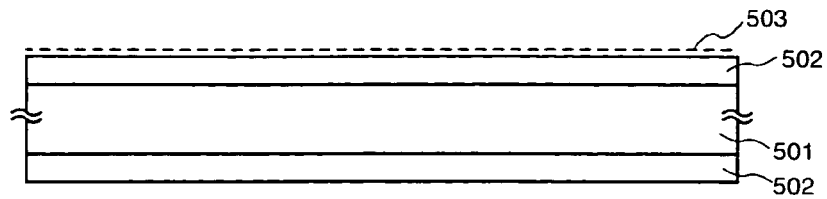
FIGS. 5A to 5E are diagrams showing a manufacturing process of a crystalline silicon film patterned into an island shape.
Figure 5B:
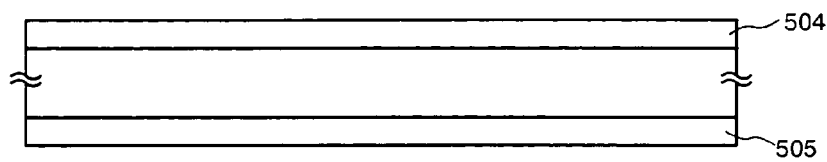
Figure 5C:
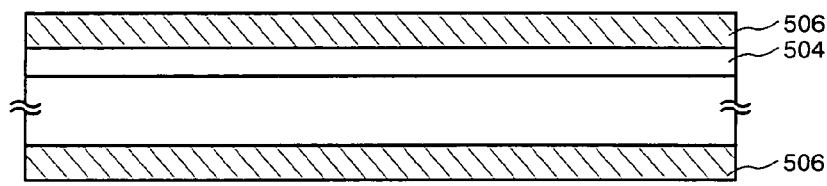
Figure 5D:
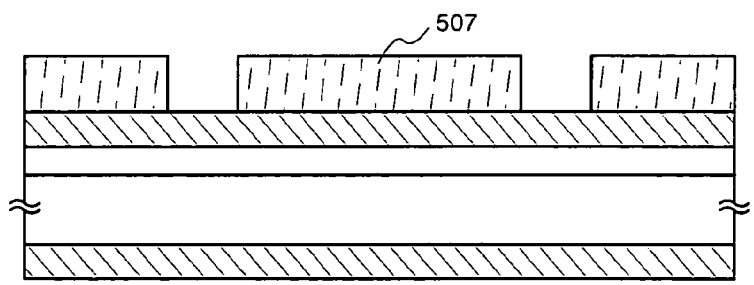
Figure 5E:
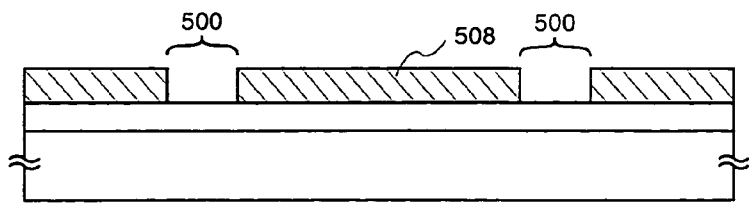
Figure 6A:
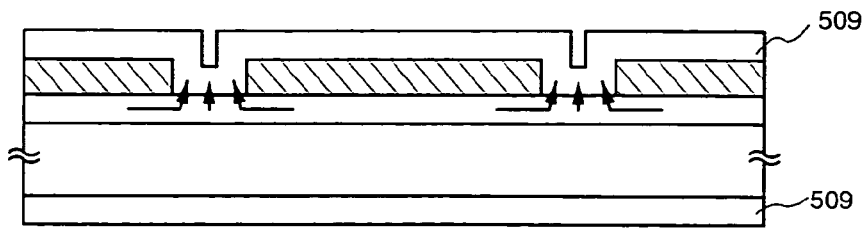
FIGS. 6A to 6D are diagrams showing a manufacturing process of a crystalline silicon film patterned into an island shape.
Figure 6B:
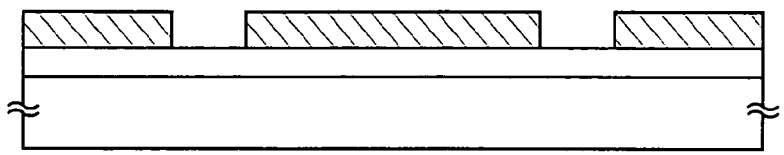
Figure 6C:
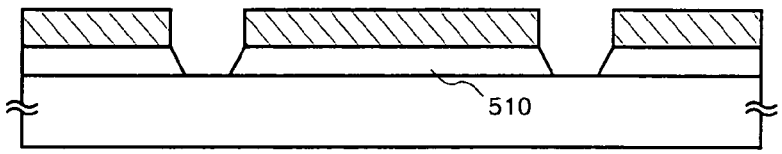
Figure 6D:
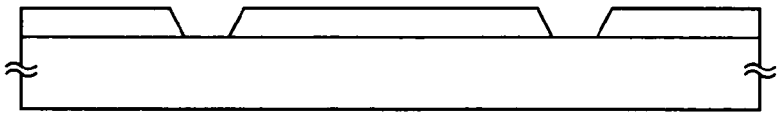

First, a state similar to that of FIG. 5E is attained in accordance with Embodiment 1. In order to remove or reduce the metallic elements from the crystalline silicon film which will be utilized as the active layer of the TFT, a silicon nitride film 601 is next formed to a thickness of between 100 and 400 nm by plasma CVD. In Embodiment 2, a 330 nm thick silicon nitride film is formed. (See FIG. 7A) Further, in addition to plasma CVD, sputtering can be used, and an $Si_xN_yO_z$ film (provided that X<<Y, Z<<Y) containing a large amount of nitrogen can also be used other than the silicon nitride film.

In case of forming the silicon nitride film by plasma CVD, any one of the mixed gas of $SiH_4$, $NH_3$, and $N_2$, the mixed gas of $SiH_4$ and $N_2$, and the mixed gas of $SiF_4$ and $N_2$ may be used as the material gas. Further, in case of forming the $Si_xN_yO_z$ film (provided that X<<Y, Z<<Y) containing a large amount of nitrogen, by plasma CVD, the mixed gas of $SiH_4$, $NH_3$, and $N_2O$ may be used.

Next, after forming the silicon nitride film 601, the second heat treatment is performed. The heat treatment at this point is conducted in a nitrogen atmosphere at a temperature of between 600° C. to 950° C. for 1 to 12 hours. In Embodiment 2, heat treatment is conducted at 950° C. for 2 hours. (See FIG. 7B) It is important that a silicon nitride film 602 is formed having its tensile stress increased to $8 \times 10^9$ (dynes/cm$^2$) or more, preferably $9.5 \times 10^9$ (dynes/cm$^2$) or more through this heat treatment.

By conducting the second heat treatment, the tensile stress of the silicon nitride film is increased as mentioned in Embodiment Modes to thereby form the silicon nitride film 602 as a gettering site. The metallic elements are transferred in the direction indicated by the arrow in FIG. 7B, whereby the metallic elements are gettered to the silicon nitride film. To classify this gettering mechanism, it falls under the segregation induced gettering.

Thereafter, the silicon nitride film 602 in which the metallic elements are gettered is removed. As a method of removing the silicon nitride film, though the method is not particularly limited, the phosphoric acid solution is used as an etchant in Embodiment 2. The phosphoric acid solution is heated on a hot plate at 100 to 150° C. to thereby remove the silicon nitride film. Because the silicon nitride film and the oxidized insulating film have a selective ratio of 55/2 to the heated phosphoric acid solution, and the silicon nitride film and the crystalline silicon film have a selective ratio of 55/1 to the heated phosphoric acid solution, it is possible to remove only the silicon nitride film. Similarly, the silicon nitride film and the oxidized insulating film have a selective ratio and the silicon nitride film and the crystalline silicon film have a selective ratio in dry etching, and therefore dry etching may also be used. (See FIG. 7C)

Using the mask made of the silicon oxide film, etching is performed next to thereby obtain the island-like crystalline silicon film. (See FIG. 7D) Drying etching (reaction gas: $CF_4/O_2$=50/45, over 20 seconds) is used in Embodiment 2.

Next, the mask that is made of the silicon oxide film is removed by using the LAL500 solution. (See FIG. 7E)

Accordingly, after the metallic elements for promoting crystallization of silicon are introduced to the amorphous silicon film, the amorphous silicon film is crystallized to thereby obtain the crystalline silicon film. Then after forming the silicon nitride film selectively in contact with the obtained crystalline silicon film, the second heat treatment is carried out, whereby the metallic elements in the crystalline silicon film are gettered.

Embodiment 3

Though an example of employing the lateral growth method as the crystallization method is shown in Embodiments 1 and 2, an example of the depth growth method will be shown in Embodiment 3 with references to FIGS. 8A to 8E.

Similar to Embodiment 1, an amorphous silicon film 702 is formed on a substrate 701. Next, after forming the silicon oxide film, patterning is performed to thereby form a mask 703 having an opening portion 700. Then, the opening portion 700, that is, the region where the nickel elements are to be doped is doped with the nickel element solution to thereby form a thin layer 704 containing nickel. (See FIG. 8A)

Thereafter, thermal crystallization is performed to obtain a crystalline silicon film 705. Through this crystallization, the crystals of the silicon which are a continuous range of crystal lattices grow linearly and even in the direction parallel with the substrate or nearly parallel therewith from the metallic element doped region. (See FIG. 8B)

As shown in Embodiment 2, a silicon nitride film 706 is next formed by plasma CVD. The silicon nitride film 706 is in contact with the crystalline silicon film through the opening portion 700. Then similar to Embodiment 2, the second heat treatment is implemented to thereby perform gettering. (See FIG. 8C) In addition, gettering may be performed by forming the silicon nitride film by LPCVD as in Embodiment 1.

Next, the silicon nitride film 706 is removed. Patterning is then performed on the crystalline silicon film by dry etching. (See FIG. 8D) It is to be noted that in Embodiment 3, the number of masks is reduced by utilizing the mask used for the introduction of the metallic elements as the patterning mask of the crystalline silicon film. Also note that after the removal of the silicon nitride film, the mask may be removed and the patterning mask of the crystalline silicon film may be formed again to perform patterning of the crystalline silicon film.

The mask 703 that is made of the silicon oxide film is then removed. (See FIG. 8E)

Thus, the mask 703 used during the introduction of the metallic elements also serves as the mask for selectively forming the silicon nitride film, and further serves as the mask for patterning of the crystalline silicon film, whereby it becomes possible to reduce the number of processes and the number of masks. Furthermore, the depth growth method shown in Embodiment 3 is preferable because an interface that will become a channel forming region later is protected by the mask 703.

Embodiment 4

The example of forming the silicon nitride film in contact with a portion of the crystalline silicon film after the formation of the mask made of the silicon oxide film was shown in Embodiments 1, 2, and 3. However, in Embodiment 4, an example of forming the silicon nitride film in contact with the entire surface of the crystalline silicon film without using a mask or performing heat treatment after the film deposition of the silicon nitride film will be shown.

In Embodiment 1, the silicon nitride film in contact with the entire surface of the crystalline silicon film may be formed by LPCVD immediately after obtaining the state of FIG. 5B.

Further, in Embodiment 2, after the silicon nitride film in contact with the entire surface of the crystalline silicon film is formed by plasma CVD immediately after obtaining the state of FIG. 5B, heat treatment may be performed.

Still further, in Embodiment 3, after crystallization and following the removal of the mask used during the doping of the metallic elements, the silicon nitride film in contact with the entire surface of the crystalline silicon film may be formed by LPCVD, or may be formed by plasma CVD and subjected to heat treatment thereafter.

When Embodiment 4 is compared with Embodiments 1, 2, and 3, an efficient gettering can be performed in Embodiment 4 because the surface area contacting the crystalline silicon film is large.

Embodiment 5

An example of manufacturing an active matrix substrate using an island-like semiconductor layer (here it is the crystalline silicon film) that can be obtained by any one of the Embodiments 1 to 4 as an active layer of a TFT will be shown in Embodiment 5 with references to FIGS. 9A to 11C.

First, in accordance with any one of the Embodiments 1 to 4, island-like semiconductors 804 to 808 are formed. (See FIG. 9A) It is to be noted that the island-like semiconductors of FIG. 9A correspond to the island-like crystalline semiconductor film of FIGS. 6D, 7E, and 8E.

A mask layer 894 made of the silicon oxide film is next formed by plasma CVD or sputtering to a thickness of 50 to 100 nm. In this state, an impurity element that imparts a p-type conductivity is doped into the island-like semiconductor layers for the purpose of controlling a threshold voltage (Vth) of the TFT. About $1 \times 10^{16}$ to $5 \times 10^{17}$ atoms/cm$^3$ of concentration of boron is doped into the entire surfaces of the island-like semiconductors. Although the doping of boron is performed after the formation of the mask layer in Embodiment 5, the sequence of the processes is not particularly limited. For example, the doping of boron may be performed prior to the formation of the island-like semiconductor layers.

Periodic table group 13 elements such as boron (B), aluminum (Al), and gallium (Ga) are known as impurity elements that impart p-type conductivity to a semiconductor. The ion injection method and the ion doping method can be used as the doping method. However, to process a large area substrate, the ion doping method is suitable. In the ion doping method, boron (B) is doped by using diborane ($B_2H_6$) as the source gas. Doping of impurity elements as such is not always necessary and there is no obstacle in omitting it, but it is a method suitably used especially for placing the threshold voltage of an N channel TFT within a predetermined range. In case of omitting the doping of impurity elements, the mask layer 894 need not be formed.

Next, etching is performed by using a solution such as fluoric acid to thereby remove the mask layer 894.

A gate insulating film 809 is formed from an insulating film containing silicon to a film thickness of between 10 to 100 nm by using plasma CVD or sputtering. In Embodiment 5, a 30 nm silicon nitride oxide film is formed for the purpose of conducting a thermal oxidation process in a later process. Further, the gate insulating film 809 may be formed to a thickness of between 100 to 150 nm without performing the thermal oxidation process later. Of course, the gate insulating film is not limited to this type of silicon nitride oxide film, but another insulating film containing silicon formed into a single layer structure or a laminate structure may also be used.

Subsequently, the thermal oxidation treatment process is conducted under an oxidic atmosphere containing halogen elements at a temperature of between 800 and 1150° C. for 15 minutes to 8 hours. (See FIG. 9C) In Embodiment 5, the thermal oxidation process is performed under an oxidic atmosphere having 3% of HCl (hydrogen chloride) doped therein at a temperature of 950° C. for 80 minutes. During the thermal oxidation process, oxidation reaction is advancing even in the interface of the insulating film containing silicon and the island-like semiconductor layers under the insulating film. Embodiment 5 takes this into consideration, and hence the film thickness of the gate insulating film that will be finally formed is regulated so that the thickness thereof is between 100 to 150 nm. In the thermal oxidation process of Embodiment 5, of the 53 nm thick island-like semiconductor layers, 25 nm are oxidized, whereby the film thickness thereof becomes 25 nm. In addition, because a 50 nm thick thermally oxidized film is added to the 30 nm thick insulating film containing silicon, the film thickness of the final gate insulating film becomes 110 nm.

The thermal oxidation process has a gettering effect, and therefore the reduction of the nickel elements in the island-like semiconductor layers can be made. Besides the oxygen atmosphere, the oxygen existing in the crystalline silicon film fulfills an important role in this gettering. That is, the coupling of oxygen and nickel forms oxidized nickel and then the nickel elements in this form are gettered into the thermally oxidized film. Further, the 100 to 150 nm thick gate insulating film may be formed after removing the thermally oxidized film in which the nickel elements have been gettered therein. Note that the details of performing gettering by the thermal oxidation process under an oxidic atmosphere containing halogen elements are disclosed in Japanese Patent Application Laid-open No. Hei 9-312260.

In order to form an LDD region of an N channel TFT of a driver circuit, an impurity element imparting n-type conductivity is selectively doped into island-like semiconductor layers 805 and 807. Resist masks 895a to 895e are formed in advance in order to perform doping of the impurity element. Phosphorus (P) and arsenic (As) may be used as the impurity elements that impart n-type conductivity. Here, in order to dope phosphorus (P), the ion doping method using phosphine ($PH_3$) is applied. Impurity regions thus formed become low concentration n-type impurity regions 896 and 897 and the concentration of phosphorus (P) contained therein may be set to between $2 \times 10^{16}$ to $5 \times 10^{19}$ atoms/cm$^3$. The concentration of the impurity element imparting n-type conductivity contained in the impurity regions 896 and 897 formed here is denoted by "n$^-$" throughout the present specification. In addition, phosphorus (P) at the same concentration is doped into an impurity region 898 that is a semiconductor layer for forming a storage capacitor of a pixel portion. (See FIG. 9D)

Next, a process of activating the doped impurity elements is performed. Activation can be carried out by heat treatment under a nitrogen atmosphere at a temperature of between 600 and 900° C. for 1 to 4 hours or by laser activation. Further, both methods may be used together. In Embodiment 5, activation is performed in an inert gas atmosphere at a temperature of 800° C. for 1 hour.

Figure 9A:
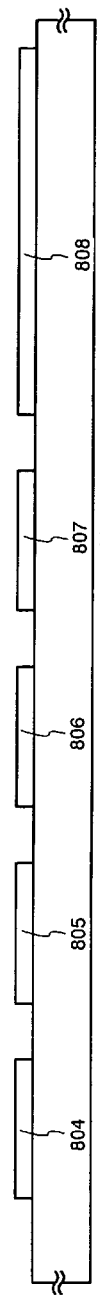
FIGS. 9A to 9E are diagrams showing manufacturing processes of an AM-LCD.
Figure 9B:
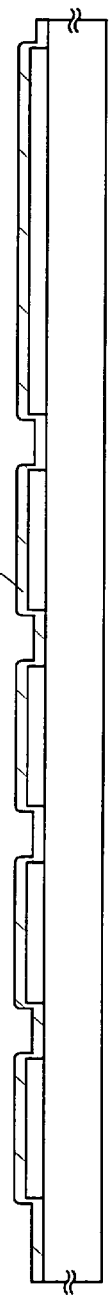
Figure 9C:
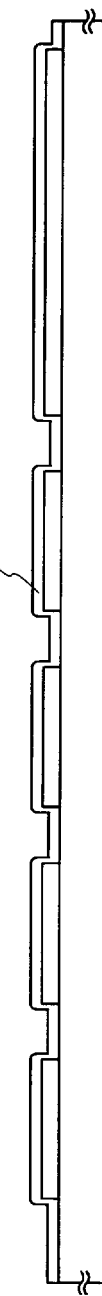
Figure 9D:
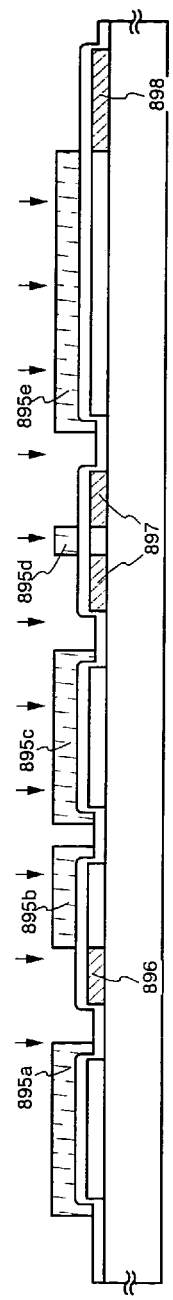
Figure 9E:
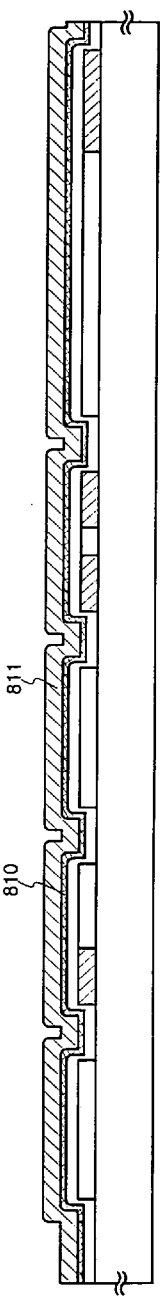

Next, as shown in FIG. 9E, a heat-resistant conductive layer is formed on the gate insulating film 809 in order to form a gate electrode. A single layer may be formed for this heat-resistant conductive layer, but a laminate structure made up of a plurality of layers such as two layers or three layers can also be formed when necessary. For example, using such heat-resistant conductive materials, the gate electrode may be a laminate structure of a conductive layer (A) 810 made from a conductive metallic nitride film and a conductive layer (B) 811 made from a metallic film. The conductive layer (B) 811 may be formed from an element selected from the group consisting of Ta, Ti, Mo, W, or from an alloy having one of these elements as its principal constituent, or from an alloy film (typically, Mo—W alloy film, Mo—Ta alloy film) of a combination of these elements. The conductive layer (A) 810 is formed from tantalum nitride (TaN), tungsten nitride (WN), titanium nitride (TiN) and molybdenum nitride (MoN). Further, tungsten silicide, titanium silicide and molybdenum silicide may be applied for the conductive layer (A) 810.

The conductive layer (A) 810 may be from 10 to 50 nm (preferably 20 to 30 nm) in thickness, and the conductive layer (B) 811 may be from 200 to 400 nm (preferably 250 to 350 nm) in thickness. In this embodiment, sputtering methode with W target (99.9999% degrees of purity) is used and Ar gas and nitrogen gas are introduced to form the conductive layer (A) 811 into 50 nm thickness by tungsten nitride (WN), and to form the conductive layer (B) into 250 nm thickness by tungsten (W). As another method, the W film may also be formed by thermal CVD methode.

Note that although not shown in the figures, it is effective to form a silicon film doped with phosphorus (P), with a thickness of about 2 to 20 nm, below the conductive layer (A) 810. By doing so, along with improving the adhesiveness of the conductive film formed on the silicon film and preventing oxidation, microscopic amounts of alkaline metal elements contained in the conductive layer (A) 810 or in the conductive layer (B) 811 can be prevented from diffusing into the gate insulating film 809. Whichever is done, it is preferable that the resistivity of the conductive layers (A) 810 and (B) 811 be in the range of 10 to 50 μΩcm.

The resist masks 812 to 817 are formed by using the photomasks. Then the conductive layer (A) 810 and the conductive layer (B) 811 are etched together to form gate electrodes 818 to 822 and a capacitor wiring 823. The gate electrodes 818 to 822 and the capacitor wiring 823 are formed integrally from conductive layers 818a to 822a, made from the conductive layer (A), and from conductive layers 818b to 822b, made from the conductive layer (B). (See FIG. 10A)

The step of doping an impurity element that imparts n-type conductivity (n⁻ dope process) is performed for the purpose of forming an LDD region of the n-channel type TFT of the pixel TFT. Using the gate electrodes 818 to 822 as masks, an impurity element that imparts n-type conductivity is doped by ion doping in a self-aligning manner. The concentration of phosphorus (P) as impurity elements, that impart n-type, is range of between $1\times10^{16}$ and $5\times10^{19}$ atoms/cm³ by such ion doping method. In this way, first impurity regions 824 to 829 are thus formed in the island-like semiconductor layer as shown in FIG. 10B.

The formation of high concentration of n-type impurity regions for functioning as a source region or a drain region in the n-channel TFT is performed next (n⁺ dope process). Using the photomasks, resist masks 830 to 834 and high concentrarion n-type impurity regions 835 to 840 doped with n-type imparting impurity region are formed. Phosphorus is used as an impurity elements which impart the n-type conductivity. The ion doping using phosphin (PH₃) is used to set into the concentration of phosphorus in these regions in the concentration range of between $1\times10^{20}$ and $1\times10^{21}$ atoms/cm³ (See FIG. 1C).

High concentraion p-type impurity regions 844 and 845 are formed next as a source region and a drain region in island-like semiconductor layers 804 and 806, which form the p-channel TFT. Here, an impurity element that imparts p-type is doped with the gate electrodes 818 and 820 as masks, and the high concentration p-type impurity region is formed in a self-aligning manner. At this point, the entire surface of island-like semiconductor layers 805, 807, and 808 that form the n-channel TFT is covered by resist masks 841 to 843, which are formed by using a forth photomask. The high concentraion p-type impurity regions 844 and 845 to be formed here are then formed by ion doping using diborane (B₂H₆). Then the boron (B) concentration is made to be from $3\times10^{20}$ to $3\times10^{21}$ atoms/cm³ (See FIG. 10D).

Since phosphorus (P) has already been doped into the high concentration p-type impurity regions 844 and 845 in the previous step, the contained concentration of the high concentration p-type impurity regions 844a and 845a is from $1\times10^{20}$ to $1\times10^{21}$ atoms/cm³ and the contained concentration of the high concentration p-type impurity regions 844b and 845b is from $1\times10^{16}$ to $5\times10^{19}$ atoms/cm³. The boron (B) concentration to be doped in this step is set to be 1.5 to 3 times that of phosphorus (P). Accordingly, no obstacles of any kind will occur for the p-type impurity regions to function as the source region and the drain region of the p-channel TFT.

Figure 11A:
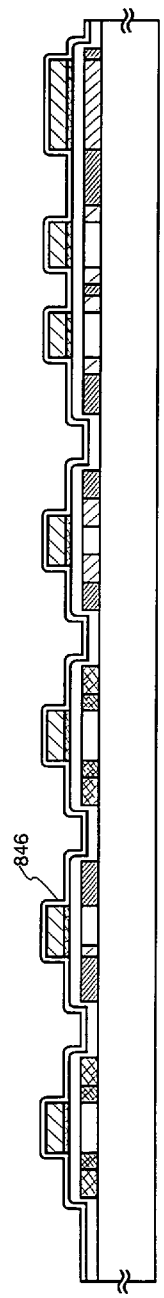
FIGS. 11A to 11C are diagrams showing manufacturing processes of an AM-LCD.
Figure 11B:
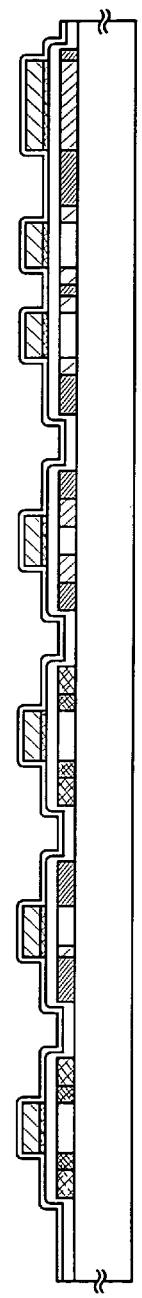

Thereafter, a protective insulating film 846 is formed on the gate electrode and the gate insulating film as shown in FIG. 11A. It is appropriate to form the protective insulating film from the silicon oxide film, the silicon nitride oxide film, the silicon nitride film, or a laminate film of a combination of these films. Whichever it is, the protective insulating film 846 is formed from an inorganic insulating material. The film thickness of the protective insulating film 846 is between 100 and 200 nm.

Next, a step of activating the impurity elements which impart n-type or p-type and have been added at the respective concentrations is performed. In this step, thermal annealing is performed by using an annealing furnace. In addition, laser annealing or rapid thermal annealing (RTA) can also be employed. Heat treatment is performed for 4 hours at 550° C. in this embodiment. (See FIG. 11B)

Following the activation process, the island-like semiconductor is hydrogenated by heat treatment at 300° C. to 450° C. for between 1 and 12 hours in an atmosphere containing between 3 and 100% hydrogen. This step is for terminating the $10^{16}$ to $10^{18}$/cm³ of dangling bonds in the island-like semiconductor layers by thermally excited hydrogen. In addition, plasma hydrogenation (using hydrogen excited by a plasma) may be performed as another means of hydrogenation.

After the completion of the activation and the hydrogenation processes, an interlayer insulating film 847 having an average thickness of between 1.0 to 2.0 μm is formed next from an organic insulating material. Materials such as polyimide, acrylic, polyamide, polyimide amide, and BCB (benzocyclobutene) can be used as the organic resin materials.

By forming the interlayer insulating film with an organic insulating material in this way, a good flat surface can be formed. In addition, organic resin materials are generally low in dielectric, and therefore parasitic capacitance can be reduced. However, because the interlayer insulating film has absorbency, it is not suitable as a protecting film. Therefore, as in this embodiment, the combination film with the silicon oxide film, the silicon nitride oxide film, the silicon nitride film, which is formed as a protecting insulating fil 846, is necessary to use.

A predetermined patterned resist mask is formed next by using a photomask, and contact holes that reach the source regions and the drain regions formed by the respective island-like semiconductor layers are formed. In this case, first the insulating film made of an organic resin material is etched using a gaseous mixture of $CF_4$, $O_2$, and He as etching gas, and then the protective insulating film 846 is etched with $CF_4$ and $O_2$ as etching gas.

A conductive metallic film is formed next by sputtering or vacuum evaporation. Then a resist mask pattern is formed by using a photomask and then etched to thereby form source wirings 848 to 852 and drain wirings 853 to 858. The drain wiring 857 here is for functioning as the pixel electrode. Although not shown in the figures, in this embodiment, these wirings are formed such that a Ti film is formed at a thickness of between 50 and 150 nm, a contact is formed in a semiconductor film that forms the source or the drain region of the island-like semiconductor layer, and an aluminum (Al) film is formed at a thickness of between 300 and 400 nm on the Ti film overlapping thereon.

Hydrogenation treatment carried out in this condition results in improvement in the TFT characteristics. For example, heat treatment in an atmosphere containing 3 to 100% of hydrogen at 300 to 450° C. for 1 to 12 hours is preferable. The use of plasma hydrogenation instead brings about similar effects. (See FIG. 11C)

Accordingly, a substrate having the TFT of the driver circuit and the pixel TFT of the pixel portion formed on the same single substrate can thus be completed. The driver circuit is composed of a first p-channel TFT 900, a first n-channel TFT 901, a second p-channel TFT 902, and a second n-channel TFT 903. The pixel portion is composed of a pixel TFT 904 and a storage capacitor 905. For the sake of convenience, this type of substrate is referred to as an active matrix substrate in the present specification.

The first p-channel TFT 900 of the driver circuit is a single drain structure having a channel forming region 906, a source region 907a,907b from high concentration p-type impurity region and a drain region 908a, 908 in the island-like semiconductor film 804. The first n-channel TFT 901 has a channel forming region 909, an LDD region 910 that overlaps the gate electrode 819, a source region 912 and a drain region 911 in the island-like semiconductor film 805.

Figure 11C:
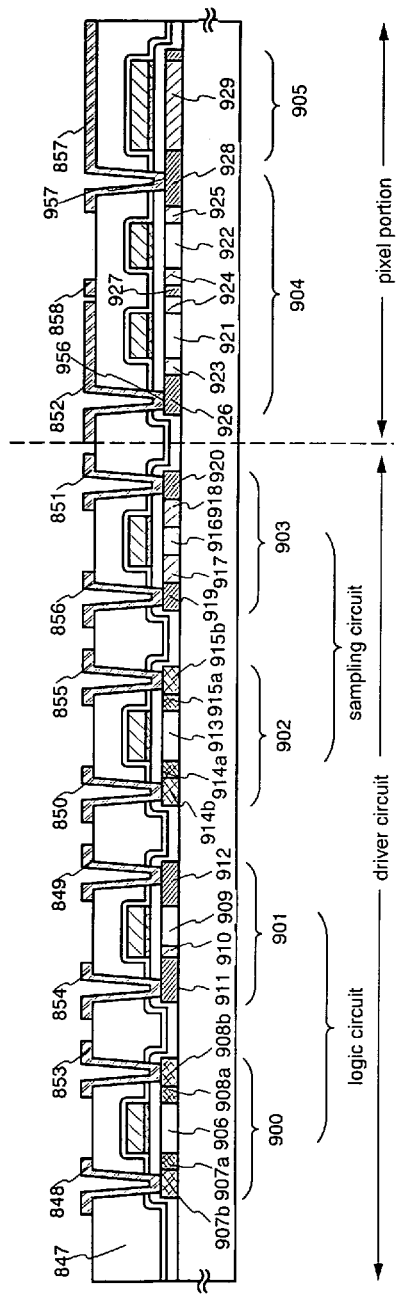

In this LDD region, the channel length direction of the Lov region, the LDD region that overlaps the gate electrode 819, is set between 0.5 and 3.0 μm, preferably from 1.0 to 2.0 μm. By setting the length of LDD region in the n-channel TFT, the high electric field that generates in the vicinity of the drain region can be relaxed, and hence the generation of a hot carrier and deterioration of the TFT can be prevented. Similarly, the second p-channel TFT 902 of the driver circuit is a single drain structure having a channel forming region 913, a source region 914a, 914 b and a drain region 915a, 915b that are formed from the high concentration p-type impurity region in the island-like semiconductor film 806. The second n-channel TFT 903 has a channel forming region 916, an LDD region 917, 918 overlapping the gate electrode 821, a source region 920 and a drain region 919 that are formed from the second impurity region in the island-like semiconductor film 807. The length of the Lov region that overlaps the gate electrode is set between 0.5 to 3.0 μm, preferably from 1.0 to 2.0 μm. The channel length direction of the Loff region, the LDD region not overlapping the gate electrode 819, is set between 0.5 and 4.0 μm, preferably from 1.0 to 2.0 μm. The pixel TFT 904 is having the channel formation region 921, 922, the LDD region 923 to 925 and the source or drain region 926 to 928 in the island semiconductor film 808. The channel length direction of the LDD region (Loff) is set between 0.5 to 4.0 μm, preferably from 1.5 to 2.5 μm. Further, the storage capacitor 905 is formed from the capacitor wiring 823, an insulating film formed by same material of the gate insulating film and the semiconductor layer 929 connecting to the drain region 928 of the pixel TFT 904. In FIG. 11C, the pixel TFT 904 is a double gate structure, however, the TFT may take either a single gate structure or a multi-gate structure in which a plural number of gate electrodes are provided. The above structure as such has made it possible to improve the operating performances and the reliability of a semiconductor device by optimizing the structure of TFTs that compose various circuits of the semiconductor device in response to the specifications required by the pixel TFT and the driver circuits.

This avtive matrix substrate can be applied to a reflector type liquid crystal display device. On the other hand, on the case of trancemission type liquid crystal display device, the pixel electrode provided in each pixel portion, is formed by transmission electrode.

Embodiment 6

A method of manufacturing an active matrix liquid crystal display device from the active matrix substrate fabricated in Embodiment 5 will be explained here in this Embodiment. As shown in FIG. 12A, first a spacer is formed on the active matrix substrate in the state of FIG. 11C. The spacer may be provided by a method of spraying several μm of grains. A method of forming the column shape spacer by patterning after forming a resin film on the entire surface of the substrate is adopted here in this embodiment.

The arrangement of the column-shape spacers may be arbitrarily determined, but preferably it is appropriate to form a column-shape spacer 868 overlapping the contact area of the drain wiring 861 (pixel electrode) in the pixel portion so as to cover that overlapped portion as shown in FIG. 12A. Liquid crystal cannot be smoothly oriented in a portion where the levelness of the contact area has been ruined. Hence, the column-shape spacer 868 is formed as in the form of filling the contact area with resin used for the spacer, whereby disclination or the like can be prevented.

Thereafter, an alignment film 874 is formed. A polyimide resin is often used for the alignment film of a liquid crystal display element. After forming the alignemnt films, a rubbing process is performed so that the liquid crystal molecules are oriented with a certain fixed pre-tilt angle. Further, since the generation of static electricity from the rubbing process is often a problem, the primary function as a spacer and an effect of protecting the TFT from the static electricity can be attained by forming the spacers 872 formed on the TFT of the driver circuit.

A light shielding film 876, a transparent conductive film 877, and an alignment film 878 are formed on an opposing substrate 875, which is opposing side. The light shielding film 876 is formed of films such as a Ti film, a Cr film, and an Al film at a thickness of between 150 and 300 nm. The active matrix substrate, on which the pixel portion and the driver circuit are formed, and the opposing substrate are then joined together by a sealing agent 879. A filler 880 is mixed into the sealing agent 879, and the two substrates are joined together with a uniform spacing by the filler 880 and the spacers 872, 873. Next, a liquid crystal material 881 is injected between both substrates and sealed completely by a sealing materials (not shown in the figures). A known liquid crystal material may be used as the liquid crystal material. In this way the active matrix type liquid crystal display device shown in FIG. 12B is completed.

Figure 13:
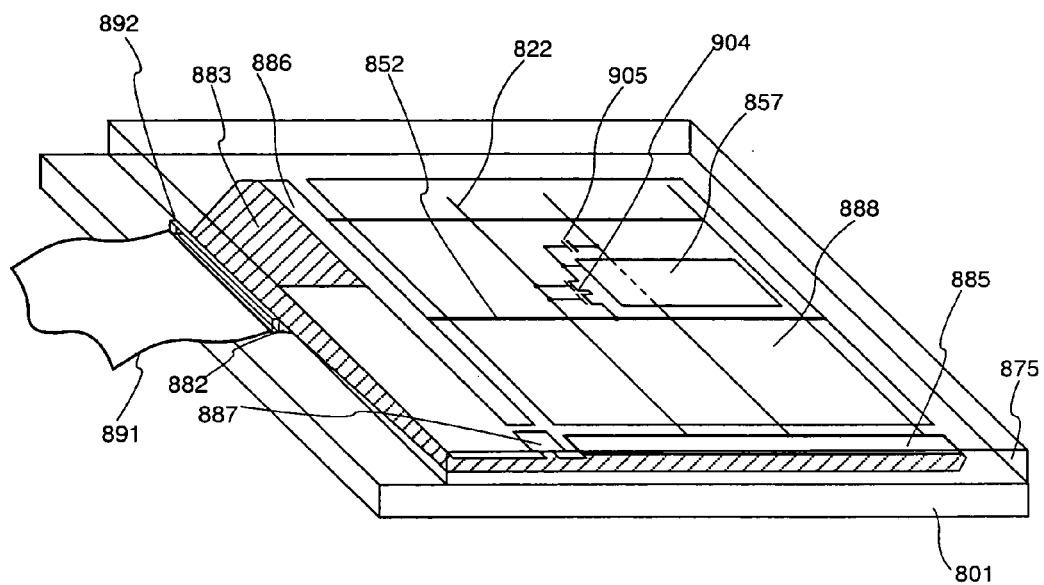
FIG. 13 is a view showing an outer appearance of the AM-LCD.

Next, the structure of this kind of active matrix liquid crystal display device is explained using the perspective view of FIG. 13. In FIG. 13, the active matrix substrate comprises the pixel portion 888, the scanning signal driver circuit 885, the image signal driver circuit 886, and the signal processing circuit 887 of the other circuits formed over the substrate 801. The pixel TFT 904 and the storage capacitor 905 are provided in the pixel portion 888, and the driver circuit formed in the periphery thereof is structured based on a CMOS circuit. The scanning signal driver circuit 885 and the image signal driver circuit 886 are connected to the pixel TFT 904 by the gate wiring 822 and the source wiring 852, respectively. Further, an FPC (flexible print circuit) 891 is connected to the external input/output terminal 882 to be utilized for inputting signals such as image signals. The connecting wiring 883 is connected to the respective driver circuits. Further, though not shown in the figure, a light shielding film and a transparent conductive film are provided on the opposing substrate 875.

Embodiment 7

This embodiment is concerned with a heat treatment at the structure shown in Embodiment 2. In Embodiment 2, an example is shown that the heat treatment is performed after the silicon nitride film contacting with entire face of crystallized silicon film is deposited by plasma CVD method. In this embodiment, in place of the heat treatment, strong beams such as laser beam, ultraviolet rays or infrared rays are used. In the case of using radiation of strong beams such as laser beams, ultraviolet rays or infrared rays, the crystallization of crystallized silicon film can be improved and the shortening steps can be realized.

The strong beams radiation such as laser beams, ultraviolet rays or infrared rays, can be performed after the heat treatment of silicon nitride film.

Further, this embodiment can be freely combined with embodiments 3 to 6.

Embodiment 8

CMOS circuits and pixel portion fabricated by implementing the present invention can be utilized for various electro-optical devices (active matrix liquid crystal display, active matrix EL display and active matrix EC display). Namely, the present invention can be implemented onto all of the electronic devices that incorporate such electro-optical devices as a display section.

Following can be given as such electronic devices: video cameras; digital cameras; projectors (rear type or front type); head mounted displays (goggle type displays); car navigation systems; car stereo; personal computers; portable information terminals (mobile computers, portable telephones or electronic books etc.) etc. Examples of these are shown in FIGS. 15, 16 and 17.

Figure 15A:
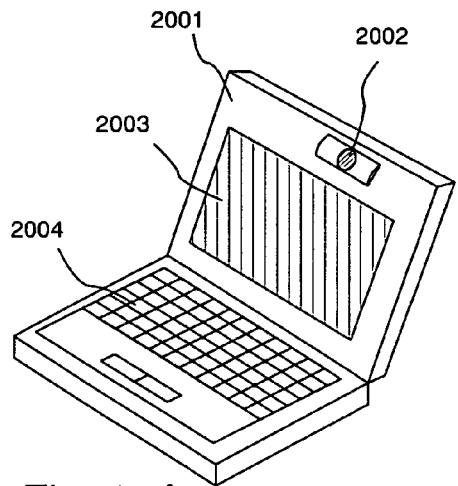
FIGS. 15A to 15F are views showing examples of electronic equipments.

FIG. 15A is a personal computer which comprises: a main body 2001; an image input section 2002; a display section 2003; and a key board 2004. The present invention can be applied to the image input section 2002, the display section 2003 and other signal control circuits.

Figure 15B:
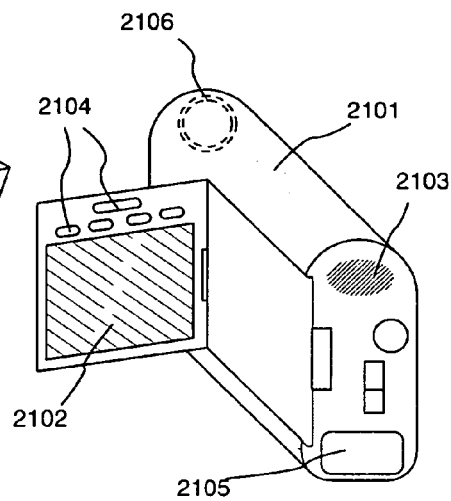

FIG. 15B is a video camera which comprises: a main body 2101; a display section 2102; a voice input section 2103; operation switches 2104; a battery 2105 and an image receiving section 2106. The present invention can be applied to the display section 2102, and other signal control circuits.

Figure 15C:
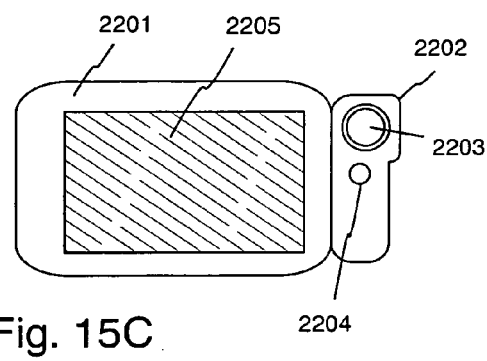

FIG. 15C is a mobile computer which comprises: a main body 2201; a camera section 2202; an image receiving section 2203; operation switches 2204 and a display section 2205. The present invention can be applied to the display section 2205 and other signal control circuits.

Figure 15D:
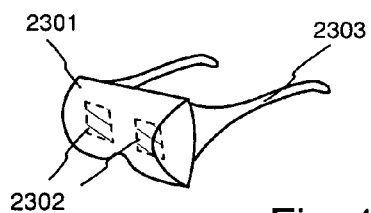

FIG. 15D is a goggle type display which comprises: a main body 2301; a display section 2302; and an arm section 2303. The present invention can be applied to the display section 2302 and other signal control circuits.

Figure 15E:
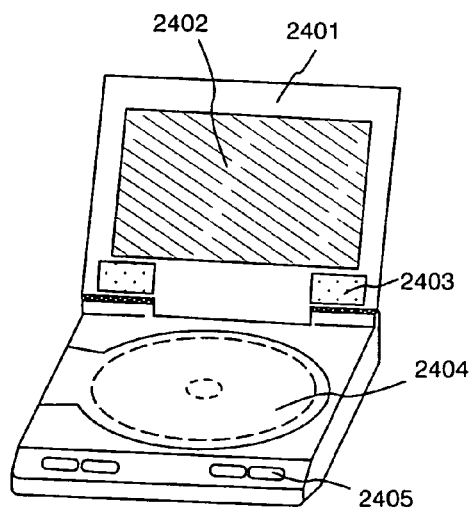

FIG. 15E is a player using a recording medium which records a program (hereinafter referred to as a recording medium) which comprises: a main body 2401; a display section 2402; a speaker section 2403; a recording medium 2404; and operation switches 2405. This device uses DVD (digital versatile disc), CD, etc. for the recording medium, and can perform music appreciation, film appreciation, games and the use for Internet. The present invention can be applied to the display section 2402 and other signal control circuits.

Figure 15F:
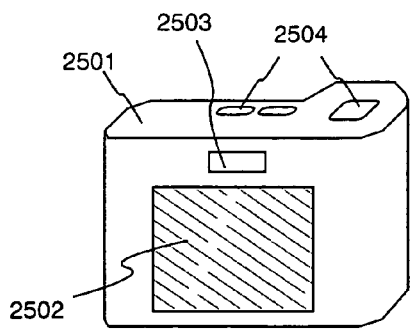

FIG. 15F is a digital camera which comprises: a main body 2501; a display section 2502; a view finder 2503; operation switches 2504; and an image receiving section (not shown in the figure). The present invention can be applied to the display section 2502 and other signal cintrol circuits.

Figure 16A:
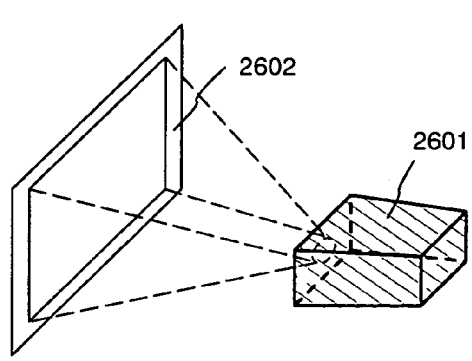
FIGS. 16A to 16D are views showing examples of electronic equipments.

FIG. 16A is a front type projector which comprises: a projection system 2601; and a screen 2602. The present invention can be applied to the projection system 2601 and other signal control circuits.

Figure 16B:
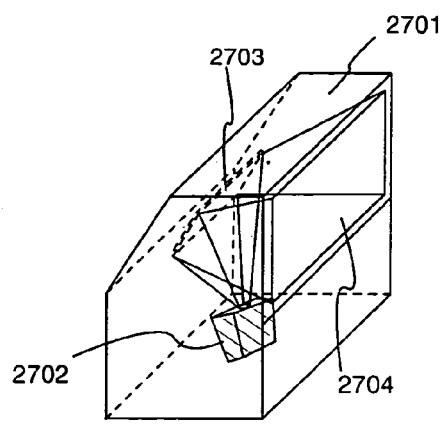

FIG. 16B is a rear type projector which comprises: a main body 2701; a projection system 2702; a mirror 2703; and a screen 2704. The present invention can be applied to the liquid crystal display device which forms a part of the projection system 2702 and other signal control circuits.

Figure 16C:
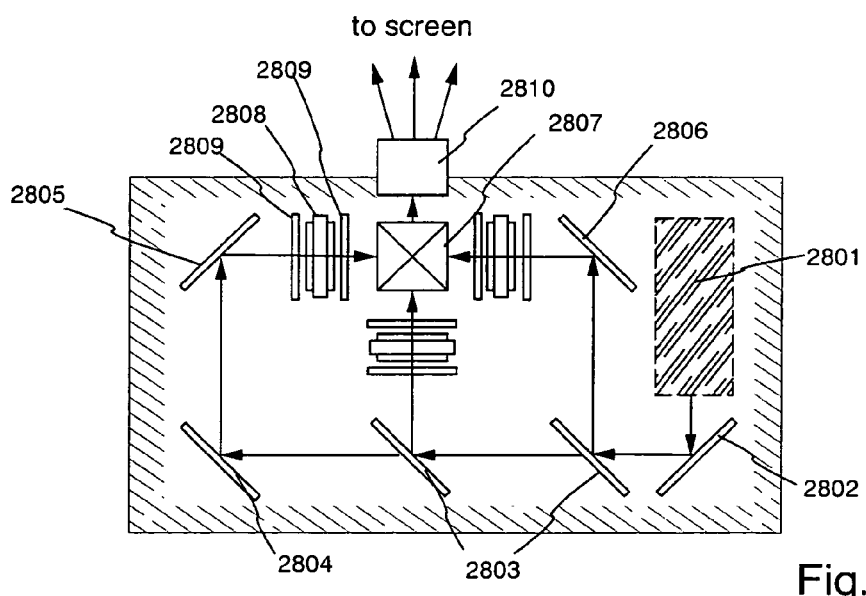

FIG. 16C is a diagram which shows an example of the structure of a projection system 2601 and 2702 in FIGS. 16A and 16B. Projection systems 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system having a projection lens. Though the present embodiment shows an example of 3-plate type, this is not to limit to this example and a single plate type may be used for instance. Further, an operator may appropriately dispose an optical lens, a film which has a function to polarize light, a film which adjusts a phase difference or an IR film, etc in the optical path shown by an arrow in FIG. 16C.

Figure 16D:
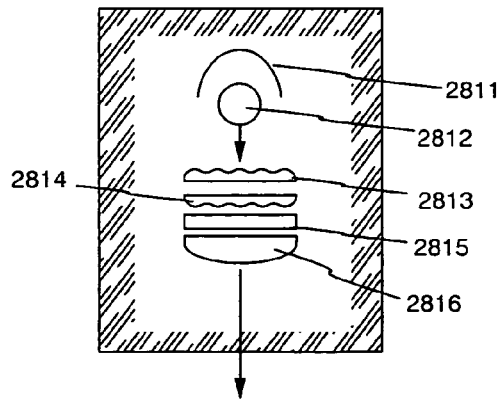

FIG. 16D is a diagram showing an example of a structure of an optical light source system 2801 in FIG. 16C. In the present embodiment the optical light source system 2801 comprises: a reflector 2811; a light source 2812; lens arrays 2813 and 2814; a polarizer conversion element 2815; and a collimator 2816. Note that the optical light source system shown in FIG. 16D is merely an example and the structure is not limited to this example. For instance, an operator may appropriately dispose an optical lens, a film which has a function to polarize light, a film which adjusts a phase difference or an IR film, etc.

Note that the projectors shown FIG. 16 are the cases of using a transmissive type electro-optical devices, and applicable examples of a reflection type electro-optical device and an EL display device are not shown.

Figure 17A:
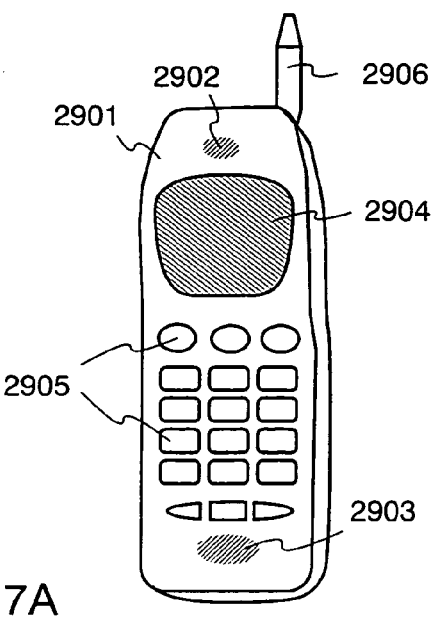
FIGS. 17A to 17C are views showing examples of electronic equipments.

FIG. 17A is a portable telephone which comprises: a main body 2901; a voice output section 2902; a voice input section 2903; a display section 2904; operation switches 2905; and an antenna 2906 etc. The present invention can be applied to the voice output section 2902, the voice input section 2903, the display section 2904 and other signal control circuits.

Figure 17B:
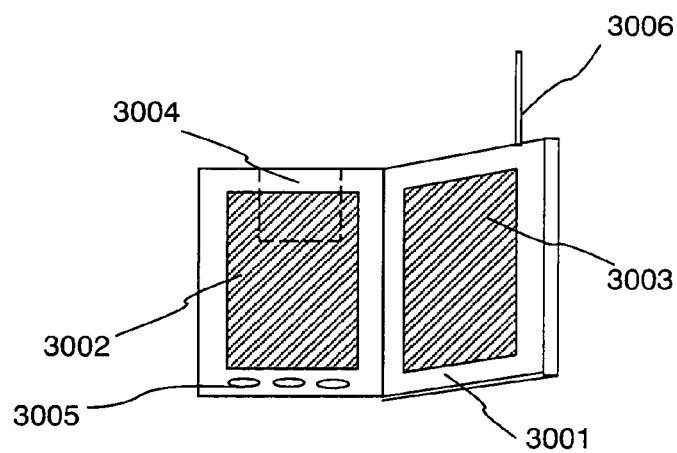

FIG. 17B is a portable book (electronic book) which comprises: a main body 3001; display sections 3002 and 3003; a recording medium 3004; operation switches 3005 and an antenna 3006 etc. The present invention can be applied to the display sections 3002 and 3003, and other signal driver circuits.

Figure 17C:
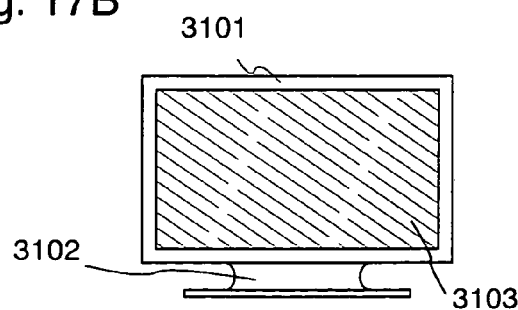
Figure 18A:
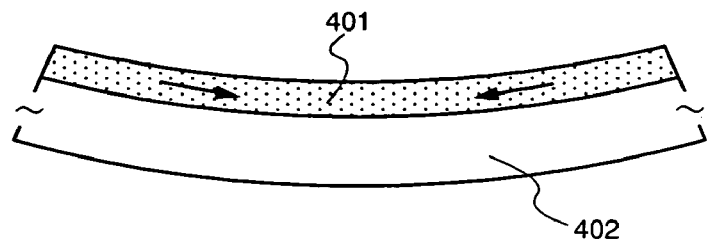
FIGS. 18A and 18B are views illustrating a tensile stress and a compressive stress.
Figure 18B:
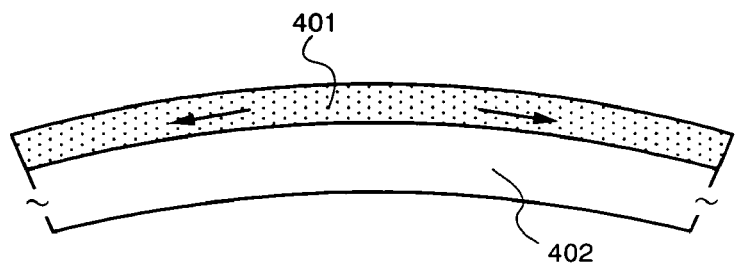

FIG. 17C is a display which comprises: a main body 3101; a supporting section 3102; and a display section 3103 etc. The present invention can be applied to the display section 3103. The display of the present invention is advantageous specifically when large sized, and it is advantageous in a display having a diagonal exceeding 10 inches (specifically exceeding 30 inches).

As described above, the applicable range of the present invention is very large, and the invention can be applied to electronic devices of various areas. Note that the electronic devices of the present embodiment can be achieved by utilizing any combination of constitutions in Embodiments 1 to 7.

Embodiment 9

An example of manufacturing an EL (electro luminescence) display device employing the present invention will be described in Embodiment 9.

Figure 19A:
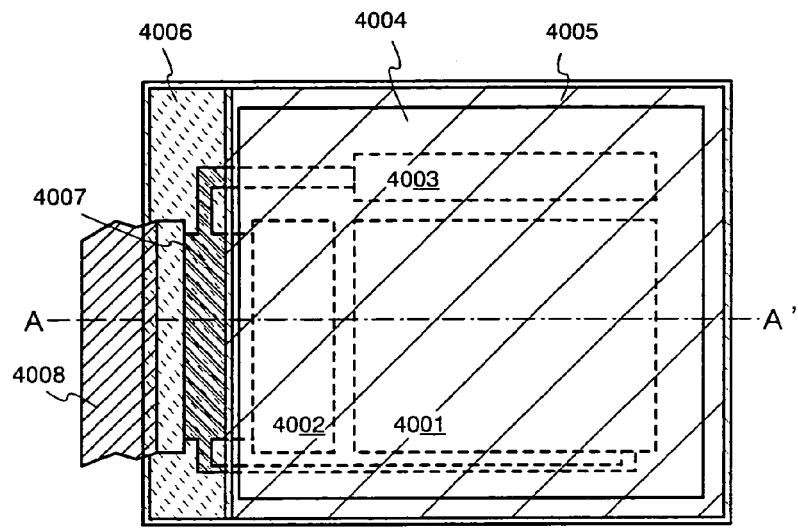
FIGS. 19A and 19B are diagrams showing a structure of an active matrix EL display device.
Figure 19B:
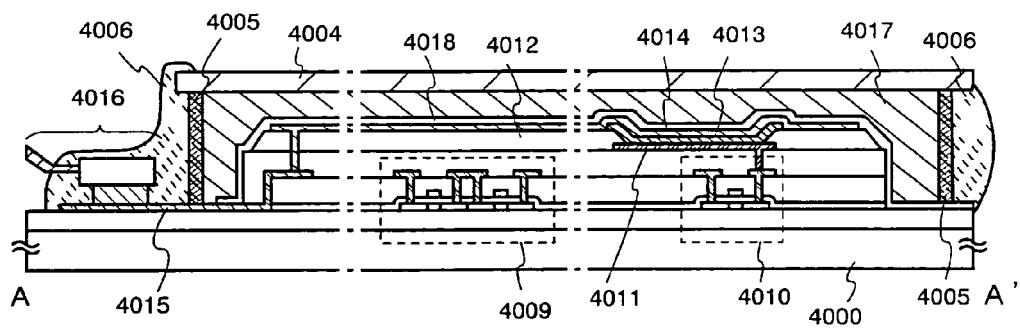

FIG. 19A is a top view of an El display device formed with a TFT that uses a crystalline silicon film formed by employing the present invention, and FIG. 19B is a sectional view thereof taken along line A–A' of FIG. 19A. Indicated by dotted lines, reference numeral 4001 denotes a pixel portion, 4002 denotes a source side driver circuit, and 4003 denotes a gate side driver circuit. Further, reference numeral 4004 denotes a covering member, 4005 denotes a first sealing member, and 4006 denotes a second sealing member.

Note that denoted by reference numeral 4007 is a wiring for transmitting a signal to be inputted to the source side driver circuit 4002 and the gate side driver circuit 4003. The wiring 4007 receives a video signal and a clock signal from an FPC (Flexible Print Circuit) 4008 serving as a connecting input terminal to an external equipment. The FPC may be attached with a print wiring basement (PWB) though onlu the FPC is shown.

The cross-sectional structure of the EL display device will be explained with reference to FIG. 19B. A pixel portion and a source side driver circuit 4009 are formed on a substrate 4000 having an insulating surface. A current controlling TFT 4010 and a plurality of pixels including pixel electrodes 4011 electrically connected to a drain thereof are included in the pixel portion, thus forming the pixel portion. However, as the source side driver circuit 4009 here, a CMOS circuit in which an N channel TFT and a P channel TFT are combined is shown as a typical example. It is to be noted that a polarized plate (typically a circular polarized plate) may be glued on the substrate 4000 having an insulating surface.

The present invention can be used in the method of manufacturing the active layer of the current controlling TFT 4010 of the pixel portion and the source side driver circuit 4009.

Banks 4012 are formed on both ends of the pixel electrodes 4011, and an EL layer 4013 and an anode 4014 of an EL element are formed on the pixel electrodes 4011. The anode 4014 also functions as a common wiring shared by all the pixels, and is electrically connected to an FPC 4016 via a connecting wiring 4015. All of the elements contained in the pixel portion and in the source side driver circuit 4009 are covered with a passivation film 4018.

The EL layer 4013 may be formed to have a lamination structure or a single layer structure by freely combining known EL materials (a hole injection layer, a hole transporting layer, a light emitting layer, an electron transporting layer, and an electron injection layer). Known techniques may be used for whichever structure is to be formed. Further, there are two types of EL materials, a low molecular weight type (monomer type) material and a high molecular weight type (polymer type) material. In case of using the low molecular weight type material, the evaporation method is used, whereas it is possible to use easier methods such as spin coating, printing, and ink-jetting for the case where the high molecular weight type material is used.

Note that both an organic compound that luminesces by a single exciton (singlet) (hereinafter referred to as a singlet compound) and an organic compound that luminesces by triple excitons (triplet) (hereinafter referred to as a triplet compound) may be used as the El layer. Also, it is to be noted that the singlet compound indicates a compound that luminesces only via the singlet exciton and the triplet compound indicates a compound that luminesces via the triplet exciton. The triplet compound has a higher luminescing efficiency than that of the singlet compound, and therefore, the operating voltage (voltage necessary for the EL element to emit light) may be lowered to obtain an equivalent luminescing brightness.

The covering member 4004 is bonded by the first sealing member 4005, and a filler 4017 is then formed inside the first sealing member 4005. The inner side of the first sealing member 4005 may be left as an opening without injecting a filler. Note that a preferable material of the first sealing member 4005 is a material that allows minimum amount of moisture and oxygen to permeate.

At this point, the filler 4017 also functions as an adhesive to bond the covering member 4004. As the filler 4017, PVC (polyvinyl chloride), epoxy resin, silicone resin, PVB (polyvinyl butylal) or EVA (ethylenevinyl acetate) can be used. It is effective to provide a material having absorbing effect and a material having oxidation preventing effect inside the filler 4017.

Further, a spacer may be provided in the filler 4017 to secure the distance between the covering member 4004 and the EL element. At this point, the spacer is a grain-like material made of BaO or the like, and the spacer itself may have moisture absorbing characteristics.

When the spacer is provided, the passivation film 4018 can relax a spacer stress. Other than the passivation film, a resin film may be provided to relax the spacer stress.

A material usable as the covering member 4004 is a glass plate, an aluminum plate, a stainless plate, an FRP (fiberglass-reinforced plastics) plate, a PVF (polyvinyl fluoride) film, a Mylar film, a polyester film, or an acrylic film. Note that when PVB or EVA is used as the filler 4017, using a sheet structured with the PVF film or the Mylar film with several tens of μm of aluminum foil sandwiched therebetween is preferable. However, depending on the luminescing direction (emission direction of light) of the EL element, the covering member 4004 is required to have transmissivity.

A 2 to 30 nm thick carbon film (specifically a diamond-like carbon film) may be provided as a protection film on the front and back surface of the covering member 4004. Such a carbon film (not shown in the figure) prevents the permeation of oxygen and moisture as well as has a role of mechanically protecting the front surface of the covering member 4004.

Then, after bonding the covering member 4004, the second sealing member 4006 is disposed so as to cover the exposed faces of the first sealing member 4005. The second sealing member 4006 may be formed from the same material as the first sealing member 4005.

By sealing the EL element using the method as described above, the EL element is completely cut off from external environment and the invasion from the outside by substances that accelerate the oxidation degradation of the EL layer, such as moisture and oxygen, can thus be prevented. Accordingly, an EL display device with high reliability can be manufactured.

Note that Embodiment 9 may be suitably and freely combined with any one of Embodiments 1 to 5. Further, employing the EL display panel of Embodiment 9 as the display portion of the electronic equipments of Embodiment 8 is effective.

Embodiment 10

Figure 20A:
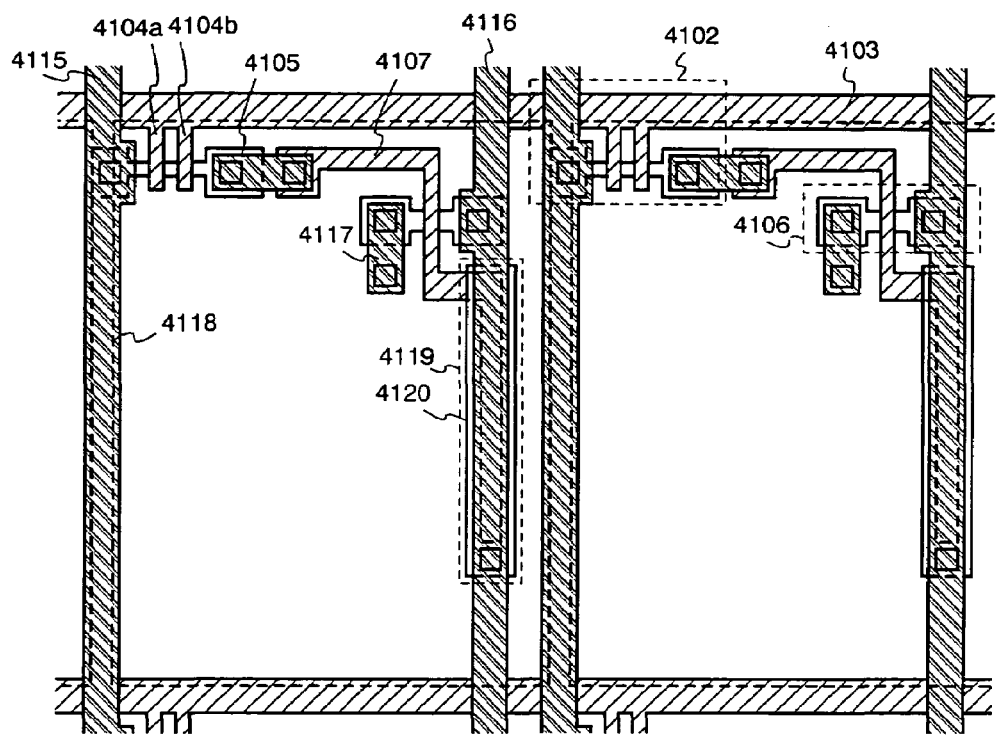
FIGS. 20A and 20B are diagrams showing a top view and a circuit configuration, respectively, of an active matrix EL display device.
Figure 20B:
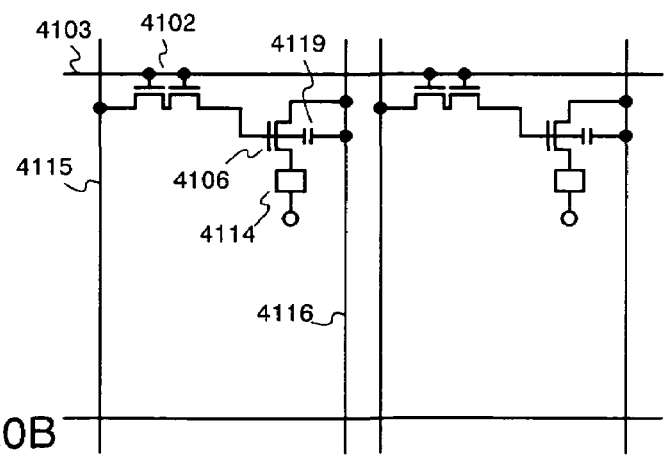

In Embodiment 10, a detailed top view of the pixel portion and a circuit configuration in the EL display device are shown in FIGS. 20A and 20B, respectively. Common reference numerals are used in FIGS. 20A and 20B, and therefore both drawings may be suitably referred.

A source of a switching TFT 4102 is connected to a source wiring 4115, and a drain thereof is connected to a drain wiring 4105. The drain wiring 4105 is electrically connected to a gate electrode 4107 of a current controlling TFT 4106. Further, a source of the current controlling TFT 4106 is electrically connected to a power supply line 4116, and a drain thereof is electrically connected to a drain wiring 4117. The drain wiring 4117 is electrically connected to a pixel electrode (cathode) 4118 indicated by the dotted line. It is to be noted that the switching TFT 4102 and the current controlling TFT 4106 may be fabricated in accordance with Embodiment 5.

At this point, a storage capacitor is formed in a region denoted by reference numeral 4119. The storage capacitor 4119 is formed between a semiconductor film 4120 electrically connected to the power supply line 4116, an insulating film (not shown in the figure) on the same layer as the gate insulating film, and the gate electrode 4107. Further, a capacitance formed at the gate electrode 4107, a layer identical to the first interlayer insulating film (not shown in the figure), and the power supply line 4116 may be used as the storage capacitor.

Note that though Embodiment 10 takes a double gate structure, a single gate structure may be formed, or a triple gate structure or a multi-gate structure having three or more gate lines may be formed.

Thus, the EL display panel of Embodiment 10 has a pixel portion made up of pixels having a structure such as shown in FIG. 20A, a switching TFT having a sufficiently low OFF current value, and a current controlling TFT that is strong to hot carrier injection. Therefore, an EL display panel having high reliability as well as capable of displaying good quality images can thus be attained.

Note that the constitution of Embodiment 10 may be freely combined with any one of the constitutions of Embodiments 1 to 5 and Embodiment 9 and implemented. Further, it is effective to employ the EL display panel of Embodiment 10 as the display portion of the electronic equipments of Embodiment 8.

Embodiment 11

In Embodiment 11, a crystalline silicon film is prepared by first doping metallic elements (here it is nickel) for promoting crystallization into the amorphous silicon film and then performing heat treatment at a temperature of 600° C. for 12 hours to thereby obtain the crystallized crystalline silicon film. Then using the mask insulating film (silicon oxide film), 2 opening portions (window) are formed so as to sandwich the region to become the channel forming region. The silicon nitride film is formed contacting the opening portions to thereby perform gettering. An examination on the relationship between the width of these windows and a distance between the two arranged windows was conducted.

Note that the crystalline silicon film exposing at the two windows doped with phosphorus (dosage of $2 \times 10^{14}$ atoms/$cm^3$) and then subjected to heat treatment at 600° C. for 12 hours is shown as a comparison example.

Figure 21:
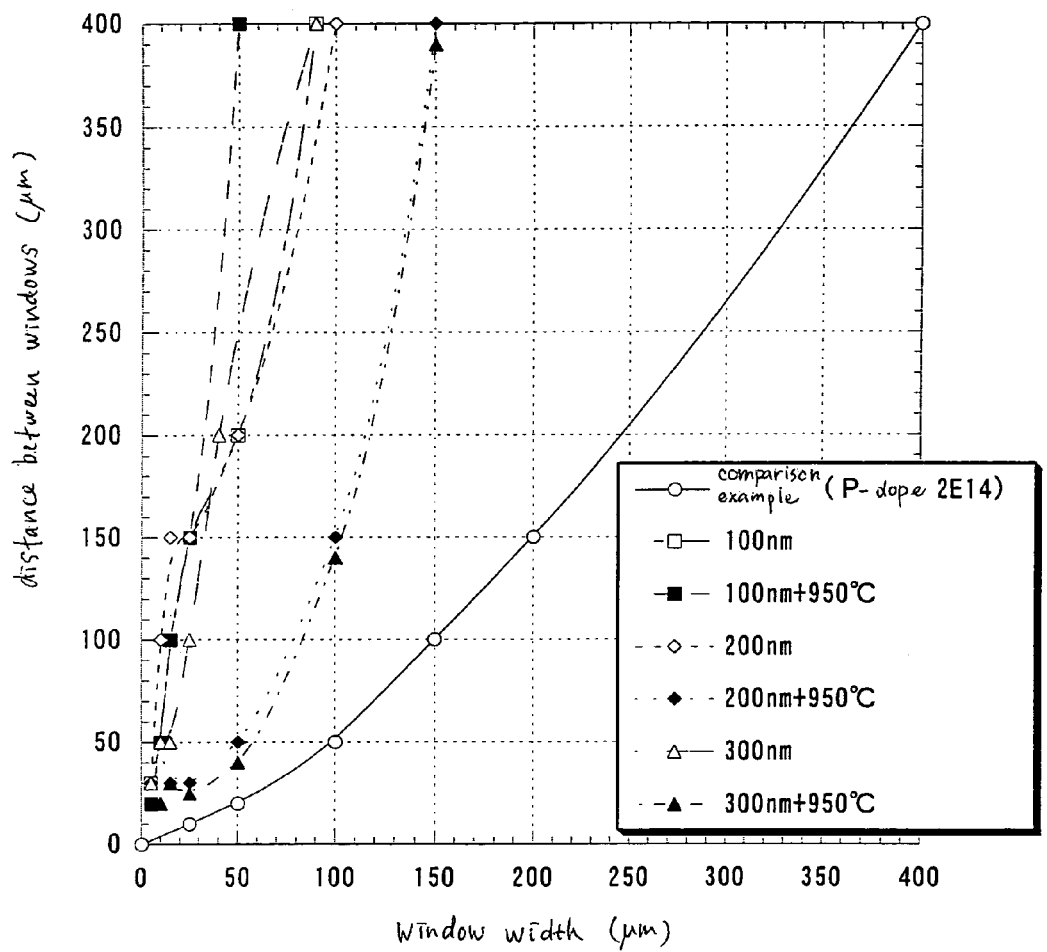
FIG. 21 is a diagram showing a relationship in a gettering region due to a window width and a window interval.

In FIG. 21, as the conditions, the film thicknesses of the silicon nitride films are set to 100 nm, 200 nm, and 300 nm respectively under the film deposition temperature of 775° C. Further, comparison was also made with the silicon nitride films with the respective film thicknesses after being subjected to heat treatment (950° C., 2 hours).

A simple explanation will be made on how to view the graph shown in FIG. 21. For example, when the distance between windows is 150 μm, then the width of the windows may be set to 200 μm or less, whereby it is possible to getter the nickel elements contained in the crystalline silicon region that is within the above window width and distance. In the case that the window width is set to 100 μm, then the distance between the windows may be set to 50 μm or more, whereby it is possible to getter the nickel elements contained in the crystalline silicon region that is within the above window width and distance.

Based on the graph (FIG. 21) shown in Embodiment 11, an implementor may appropriately design the window width and the distance between windows to thereby getter the metallic elements for promoting crystallization that exist in desired regions by using the silicon nitride film according to the present invention.

Embodiment 12

In Embodiment 12, an example of combining the gettering method of the present invention with another gettering method (a technique of selectively doping phosphorus and performing heat treatment (Japanese Patent Application Laid-open No. Hei 10-247735)) will be described. This example is shown in FIGS. 22A to 22E. Although there is a fear of generating a chemical contamination in the clean room when the gettering technique of doping phosphorus is used, a better gettering effect can be obtained.

In Embodiment 12, nickel, used as the metallic element for promoting crystallization, is doped into an amorphous silicon film by using a mask. After obtaining a crystalline silicon film by subjecting the amorphous silicon film to heat treatment, the silicon nitride film of the present invention is formed covering the mask or heat treatment is conducted after the formation thereof to thereby perform gettering.

Figure 8A:
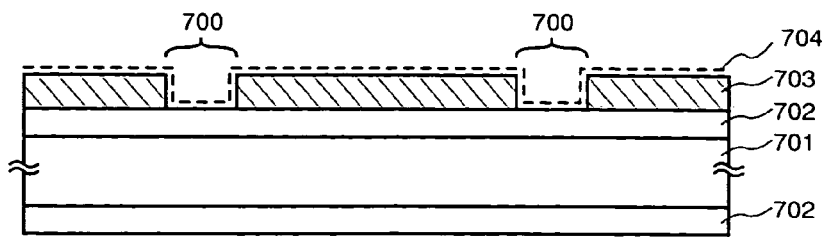
FIGS. 8A to 8E are diagrams showing a manufacturing process of a crystalline silicon film patterned into an island shape in accordance with a third embodiment of the present invention.
Figure 8B:
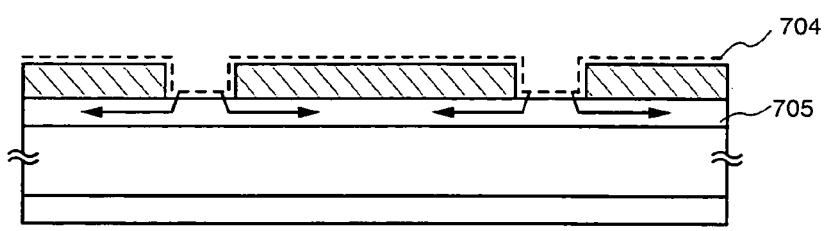
Figure 8C:
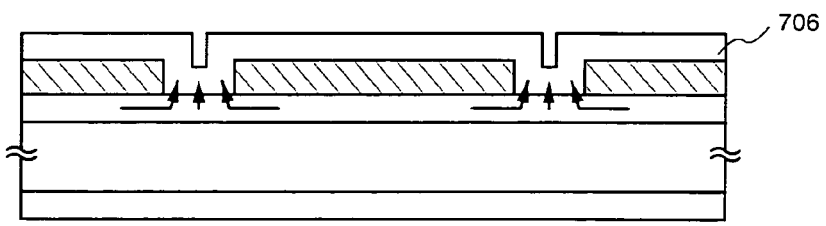
Figure 8D:
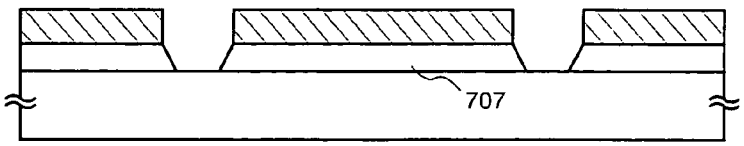
Figure 8E:
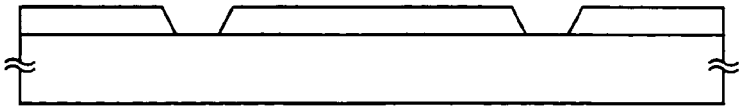
Figure 22A:
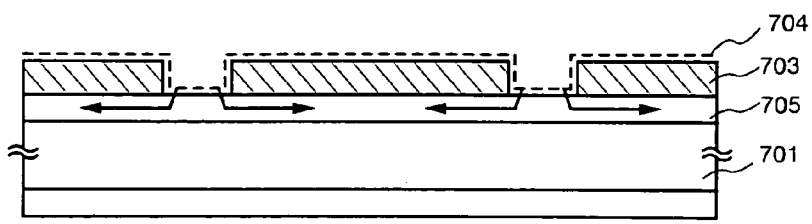
FIGS. 22A to 22E are diagrams showing manufacturing processes of a crystalline silicon film in accordance with a twelfth embodiment of the present invention.
Figure 22B:
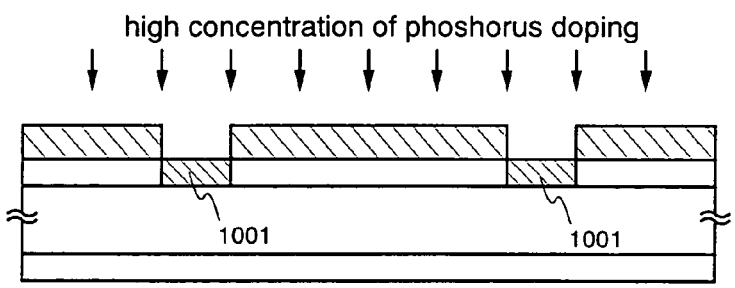
Figure 22C:
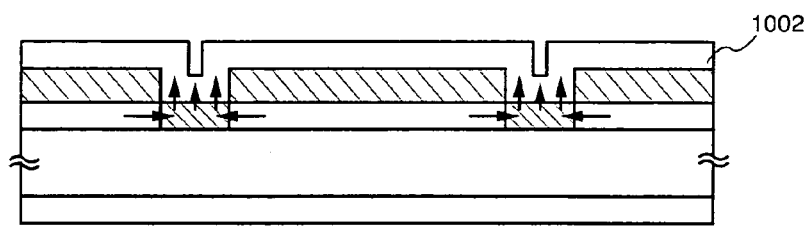
Figure 22D:
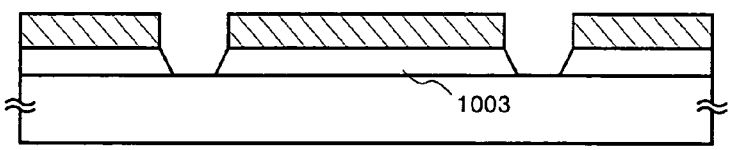
Figure 22E:
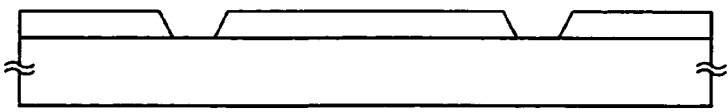

First, a state similar to that of FIG. 8B is obtained in accordance with Embodiment 3. FIG. 22A is identical with FIG. 8B and therefore the same reference numerals are used.

Using the mask 703, a high concentration of phosphorus is next doped into the crystalline silicon film to thereby form a gettering region 1001. (See FIG. 22B)

Then a silicon nitride film 1002 is formed by LPCVD covering the mask 703, and then nickel is gettered into the silicon nitride film. (See FIG. 22C) At this point, the nickel contained in the crystalline silicon film can be transferred to the gettering region 1001 at the temperature (775° C.) during film deposition. In order to obtain a better gettering effect, heat treatment (under a nitrogen atmosphere at a temperature of between 450 and 650° C. (preferably between 500 and 550° C.) for 4 to 24 hours (preferably 6 to 12 hours)) may be performed. Through Embodiment 12, the nickel inside the crystalline silicon film is efficiently gettered due to the gettering action by the silicon nitride film and the gettering action of phosphorus.

Further, by performing heat treatment after the formation of the silicon nitride film by PCVD, the nickel in the crystalline silicon film may be efficiently gettered by the gettering action of phosphorus and the gettering action by the silicon nitride film.

Next, after removing the silicon nitride film 1002, patterning is performed using the mask 703 as the patterning mask. The silicon nitride film on the back surface of the substrate is removed together with the removal of the gettering region 1001. (See FIG. 22D)

The mask 703 is removed next. (See FIG. 22E)

The TFT can be obtained by performing the subsequent processes in accordance with Embodiment 5.

Note that Embodiment 12 may be freely combined with any one of Embodiments 6 to 10.

Embodiment 13

In Embodiment 13, an example of combining the gettering method of the present invention with another gettering method (a technique of selectively doping phosphorus and performing heat treatment) will be described. This example is shown in FIGS. 23A to 23E. Although there is a fear of generating a chemical contamination in the clean room when the gettering technique of doping phosphorus is used, a better gettering effect can be obtained.

In the manufacturing process of the TFT in Embodiment 13, the silicon nitride film of the present invention is formed during the activation of the impurity elements doped into a region that is to become either a source region or a drain region, to thereby perform gettering and at the same time to getter the nickel, which is contained in a region that is to become a channel forming region, to a region (source region or drain region) containing phosphorus at a high concentration.

First, the state of FIG. 10C is obtained in accordance with Embodiment 5. Shown in FIG. 23A are the N channel TFT and the P channel TFT in the driver circuit of FIG. 10C, and therefore the same reference numerals are used. At this point, the region doped at a high concentration becomes the source region or the drain region. It is to be noted that the doping of phosphorus is not limited to the N channel TFT, but the region that will become the source region or the drain region of the P channel TFT is also doped with phosphorus at a high concentration.

Similar to Embodiment 5, the doping of high concentration boron is performed next to thereby obtain the state of FIG. 10D. FIG. 23B corresponds to FIG. 10D, and therefore the same reference numerals are used.

Subsequently, etching is performed using the gate electrode as the mask, thereby forming an insulating film 1100 together with exposing a portion of the semiconductor layer. (See FIG. 23C)

Thereafter, the silicon nitride film 1101 of the present invention is formed to thereby perform gettering. (See FIG. 23D) At this point, the nickel contained in the crystalline silicon film can be transferred to the high concentration regions, 836, 845a, and 845b by the temperature (775° C.) during film deposition. In order to obtain a better gettering effect, heat treatment (under a nitrogen atmosphere at a temperature of between 450 and 650° C. (preferably between 500 and 550° C.) for 4 to 24 hours (preferably 6 to 12 hours)) may be performed. Through Embodiment 13, the nickel inside the crystalline silicon film is efficiently gettered due to the gettering action by the silicon nitride film and the gettering action of phosphorus. In addition, if the impurity elements in the impurity region are activated by this heat treatment, then the number of processes is reduced.

Further, by performing heat treatment after the formation of the silicon nitride film by PCVD, the nickel in the crystalline silicon film may be efficiently gettered by the gettering action of phosphorus and the gettering action by the silicon nitride film.

Next, the silicon nitride film 1101 is removed. (See FIG. 23E)

Subsequent processes are performed in accordance with Embodiment 5, and if processes such as hydrogenation and the formation of an interlayer insulating film are performed, then a structure similar to that of FIG. 11C can be formed.

Note that Embodiment 13 may be freely combined with any one of Embodiments 6 to 10.

Embodiment 14

In Embodiment 14, an example of combining the gettering method of the present invention with another gettering method (performing heat treatment at a high temperature under an atmosphere containing halogen elements (Japanese Patent Application Laid-open No. Hei 9-312260)) will be described. This example is shown in FIGS. 24A to 24E.

In Embodiment 14, nickel, used as the metallic element for promoting crystallization, is doped into an amorphous silicon film. After obtaining a crystalline silicon film by subjecting the amorphous silicon film to heat treatment, a mask is formed. Then the silicon nitride film of the present invention is formed covering the mask, thereby performing gettering or heat treatment is performed after the formation thereof to thereby perform gettering. Thereafter, the silicon nitride film and the mask are removed and heat treatment is implemented at a high temperature under an atmosphere containing halogen elements to thereby form a thermally oxidized film. Consequently, the nickel elements are gettered to this thermally oxidized film.

Figure 7A:
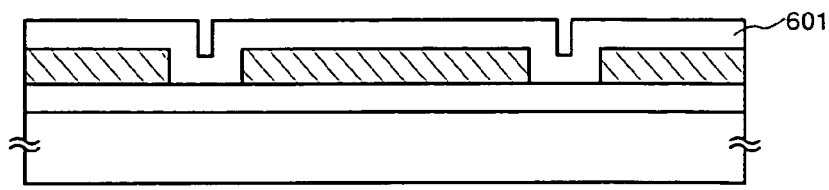
FIGS. 7A to 7E are diagrams showing a manufacturing process of a crystalline silicon film patterned into an island shape in accordance with a second embodiment of the present invention.
Figure 7B:
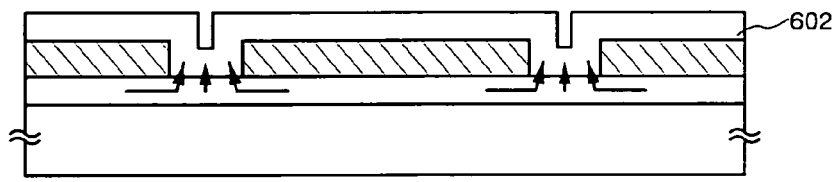
Figure 7C:
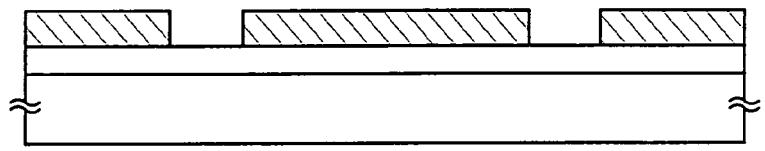
Figure 7D:
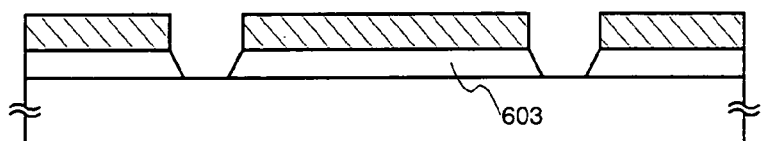
Figure 7E:
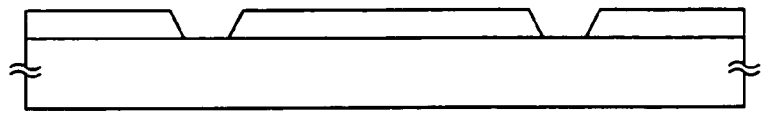
Figure 24A:
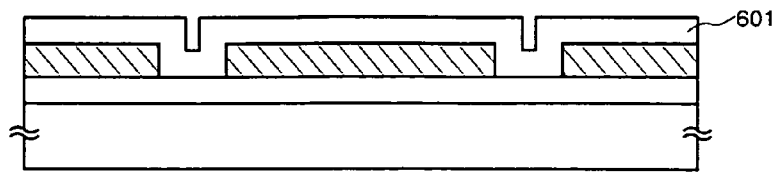
FIGS. 24A to 24E are diagrams showing manufacturing processes of a crystalline silicon film in accordance with a fourteenth embodiment of the present invention.

First, a state similar to that of FIG. 7A is obtained in accordance with Embodiment 2. FIG. 24A is identical with FIG. 7A, and therefore the same reference numerals are used.

Figure 24B:
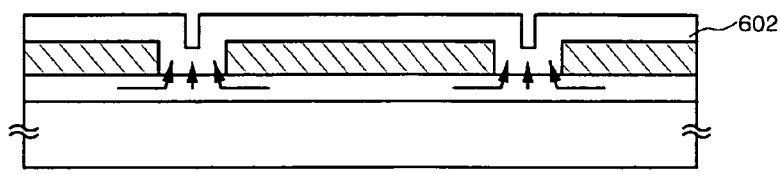

Similar to Embodiment 2, heat treatment is performed next to thereby perform gettering. FIG. 24B is identical with FIG. 7B, and therefore the same reference numerals are used.

Figure 24C:
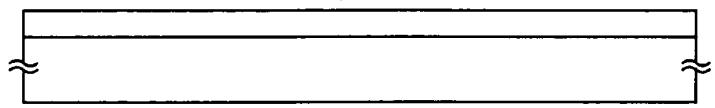
Figure 24D:
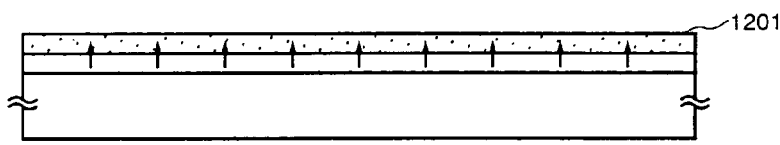
Figure 24E:
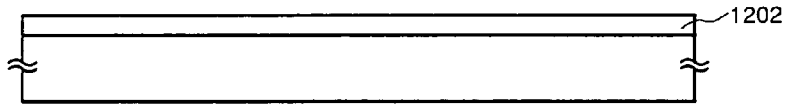
Figure 25A:
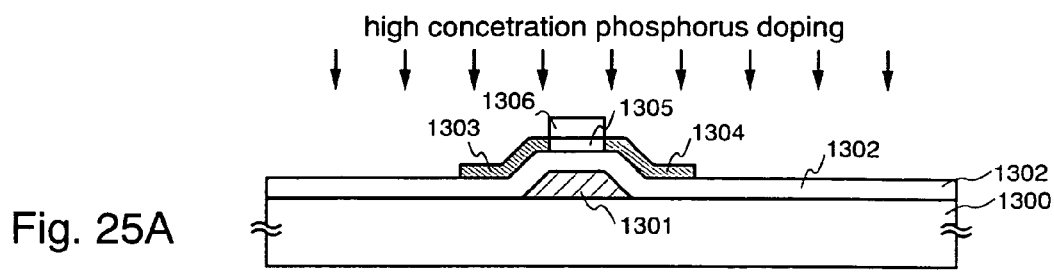
FIGS. 25A to 25D are diagrams showing manufacturing processes of a TFT in accordance with a sixteenth embodiment of the present invention.
Figure 25B:
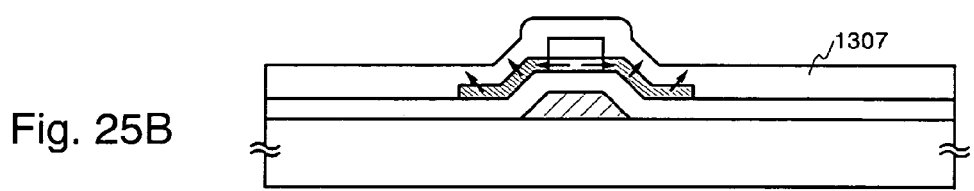
Figure 25C:
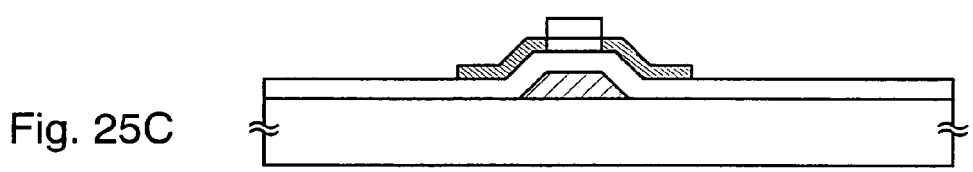
Figure 25D:
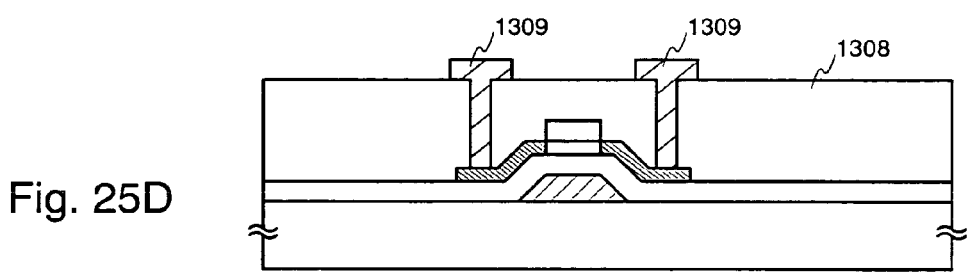

Next, the mask and the silicon nitride film 602 are removed to thereby expose the crystalline silicon film, whereby the state of FIG. 24C is obtained.

Heat treatment is next performed at a temperature of between 800 and 1150° C. (preferably between 900 and 1000° C.) for 15 minutes to 8 hours (preferably 30 minutes to 2 hours) under an oxygen atmosphere containing halogen elements. Through this heat treatment process, oxidation reaction advances, thereby forming the thermally oxidized film, and the nickel elements are gettered thereto. (See FIG. 24D)

Thereafter, the thermally oxidized film is removed, resulting in obtaining a crystalline silicon film in which the nickel elements containing therein are reduced. (See FIG. 24E)

The TFT can thus be manufactured by performing subsequent processes in accordance with Embodiment 5.

Note that Embodiment 14 may be freely combined with any one of Embodiments 6 to 10.

Embodiment 15

An example of performing gettering by utilizing a large stress region that is formed by using a mask made of a silicon oxide film having a thick film thickness is shown in Embodiment 15.

A comparison experiment was conducted by forming the mask, which is formed in Embodiment 3, with respective thicknesses of 100 nm and 200 nm.

As a result, a more effective gettering was made in case of forming the silicon nitride film after forming the 200 nm thick mask to thereby perform gettering than in case of forming the 100 nm thick mask. It is surmised that by making the film thickness of the mask thick, a partially large stress silicon nitride film was formed. Therefore, better gettering effect can be obtained as the film thickness is made thicker.

Note that Embodiment 15 may be freely combined with any one of Embodiments 1 to 13.

Embodiment 16

Though shown in Embodiment 5 is the example of applying the present invention to a top gate type TFT, an example of applying the present invention to a bottom gate type TFT will be described in Embodiment 16 and illustrated in FIGS. 25A to 25D.

First, a gate insulating film 1302 is formed after forming a gate electrode 1301 on a substrate 1300 having an insulating surface. Next, after forming an amorphous silicon film, crystallization is carried out using metallic elements for promoting crystallization. Then patterning is performed on the crystalline silicon film thus formed. Next, after a mask 1306 made of a silicon oxide film is formed covering a region that becomes a channel forming region 1305, phosphorus is doped into the crystalline silicon film using this mask to thereby form an impurity region 1304 that will become the source region or the drain region. (See FIG. 25A) The N channel TFT doped with phosphorus is shown here as an example.

The silicon nitride film 1305 of the present invention is formed next covering the impurity region 1304 and the mask 1306.

Subsequently, after forming an interlayer insulating film 1308, a contact hole is formed to reach the impurity region. Then an electrode 1309 that will serve as a source wiring or a drain wiring is formed. A bottom gate type N channel TFT can thus be formed.

Note that it is possible to apply the bottom gate type TFT of Embodiment 16 instead of the top gate type TFT shown in Embodiment 5. Furthermore, Embodiment 16 may be freely combined with any one of Embodiments 6 to 10.

Though shown in Embodiment 16 is the example of a typical bottom gate type TFT, needless to say, the present invention can be utilized in various structures of the bottom gate type TFT.

Thus, according to the present invention, the metallic elements in the crystalline silicon film obtained by utilizing metallic elements for promoting crystallization of silicon can be removed or the concentration thereof can be reduced. The metallic elements are gettered by using the silicon nitride film having a tensile stress of $8 \times 10^9$ dynes/cm$^2$ or more, preferably $9.5 \times 10^9$ dynes/cm$^2$ or more, resulting in the attainment of an excellent crystalline silicon film.

In addition, because the process of using phosphorus can be performed to a minimum, the generation of chemical contamination by phosphorus in the clean room which is a conventional problem can be reduced.

Embodiment 17

Figure 26:
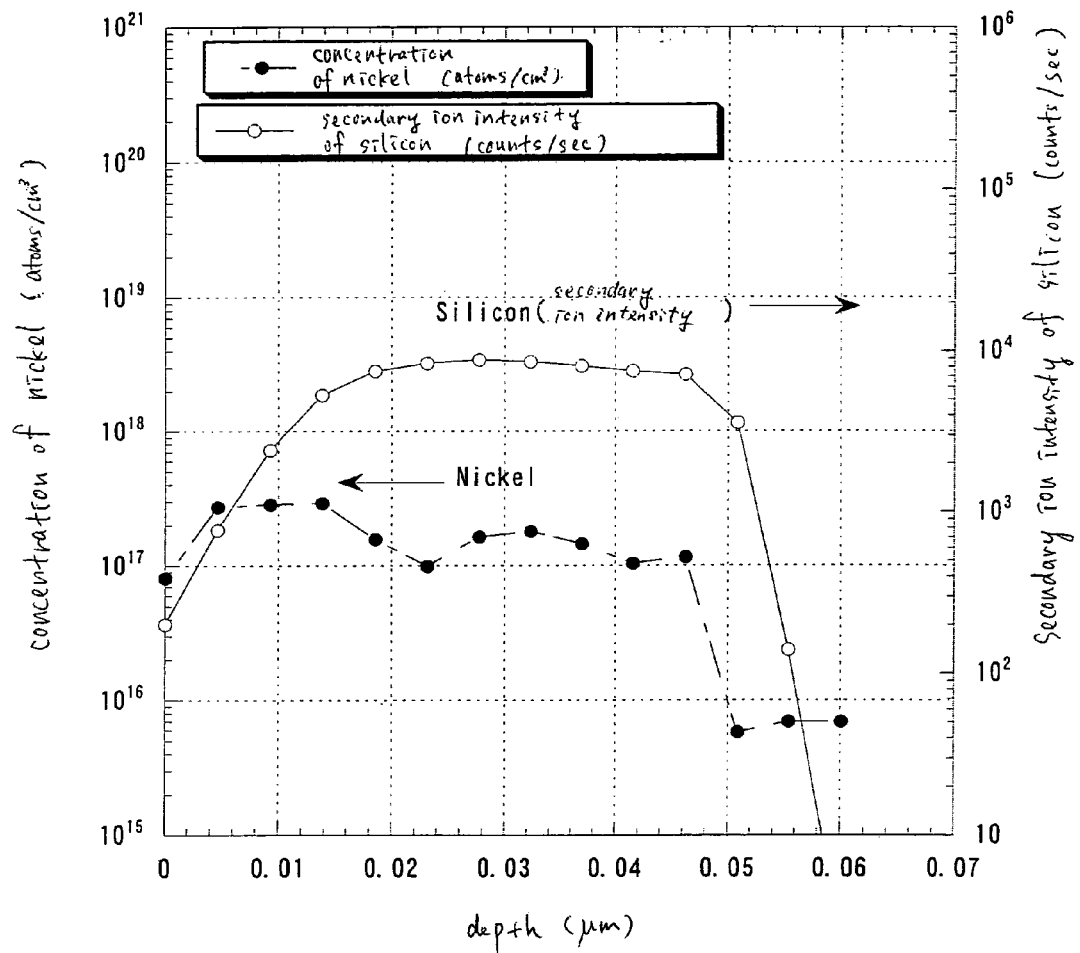
FIG. 26 is a diagram showing the concentration of nickel after the treatment.

In Embodiment 17, a concentration of nickel contained in crystalline silicon film which is obtained by following Embodiment 1 or Embodiment 2 is shown in FIG. 26.

First, after an amorphous silicon film (film thickness 69 nm) is formed on the substrate, the amorphous silicon film is crystallized by introducing nickel element through nickel acetate aqueous solution (5 ppm) and carrying out a heat treatment. Next, a silicon nitride film is formed to a thickness 200 nm by the LPCVD after a mask insulating film having an opening portion is provided. Further, the nickel element is absorbed in the silicon nitride film by a gettering through a heat treatment in a nitrogen atmosphere at temperature of 950° C. for two hours.

Next, a concentration of nickel contained in the crystalline silicon film in which the silicon nitride film has been removed is measured by the SIMS analysis. The data is shown in FIG. 26.

In addition, for the comparison, the concentration of nickel in the crystalline silicon film before forming the silicon nitride film is measured by the SIMS analysis. The data is shown in FIG. 27.

Figure 27:
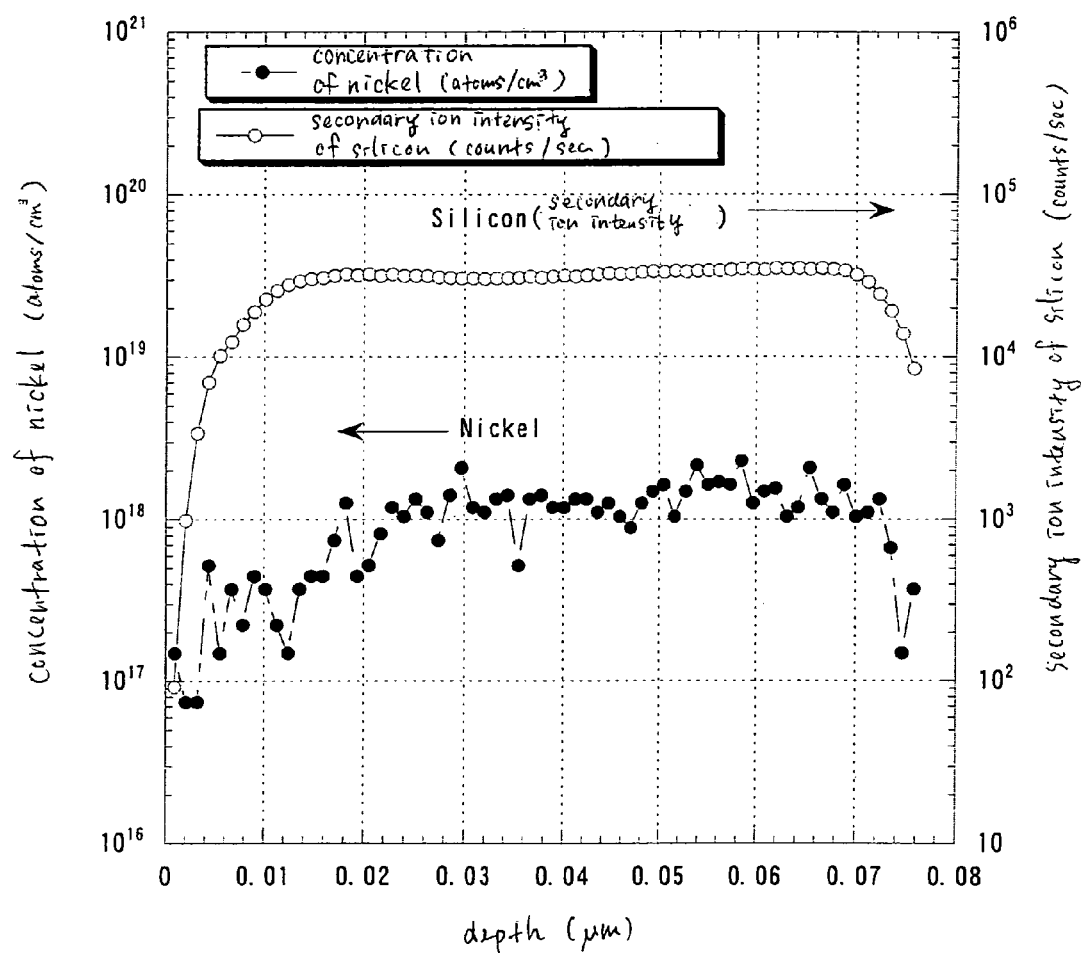
FIG. 27 is a diagram showing the concentration of nickel before the treatment.

According to FIGS. 26 and 27, it is found that the concentration of nickel is reduced by use of the present invention. For example, at a portion of 0.04 to 0.05 μm depth, the concentration of nickel is reduced from approximately $1.5 \times 10^{18}$/cm$^3$ to approximately $1.0 \times 10^{17}$/cm$^3$ by use of the present invention.

TABLE 1

| condition | | film thickness (nm) | condition of thermal treatment | gettering effect |
|---|---|---|---|---|
| 1 | silicon nitride film formed by plasma CVD | 150 | None | x |
| 2 | silicon nitride film formed by plasma CVD | 150 | 600° C., N$_2$, 12 hr | ○ |
| 3 | silicon nitride film formed by plasma CVD | 150 | 950° C., N$_2$, 2 hr | ○ |
| 4 | silicon nitride film formed by plasma CVD | 330 | None | x |
| 5 | silicon nitride film formed by plasma CVD | 330 | 600° C., N$_2$, 12 hr | ○ |
| 6 | silicon nitride film formed by plasma CVD | 330 | 950° C., N$_2$, 2 hr | ○ |
| 7 | silicon nitride film formed by plasma CVD | 470 | None | x |
| 8 | silicon nitride film formed by plasma CVD | 470 | 600° C., N$_2$, 12 hr | ○ |
| 9 | silicon nitride film formed by plasma CVD | 470 | 950° C., N$_2$, 2 hr | ○ |

TABLE 1-continued

| con- dition | | film thickness (nm) | condition of thermal treatment | gettering effect |
|---|---|---|---|---|
| 10 | silicon nitride film formed by LPCVD | 300 | None | ○ |
| 11 | silicon nitride film formed by LPCVD | 300 | 950° C., N$_2$, 2 hr | ○ |

What is claimed is:

1. A method of manufacturing a semiconductor device comprising the steps of:
   forming a semiconductor film over a substrate; and
   forming a material having a tensile stress of 8×10$^9$ dynes/cm$^2$ or more in contact with the semiconductor film, whereby an impurity element in the semiconductor film is gettered into the material.

2. A method of manufacturing a semiconductor device according to claim 1, wherein said material is formed by LPCVD within a temperature range of between 500 and 900° C.

3. A method of manufacturing a semiconductor device according to claim 1, wherein said material is formed by LPCVD within a pressure range of between 0.1 and 3 Torr.

4. A method of manufacturing a semiconductor device according to claim 1, wherein said material is formed by LPCVD with a gas containing chlorine as a material gas.

5. A method of manufacturing a semiconductor device according to claim 4, wherein the gas containing chlorine is a mixture gas that contains any one of SiCl$_4$, SiH$_2$Cl$_2$, SiCl$_3$, and Si$_2$Cl$_6$.

6. A method of manufacturing a semiconductor device according to claim 1, wherein said material is a silicon nitride film formed by LPCVD.

7. A method of manufacturing a semiconductor device according to claim 6, wherein a composition ratio of N/Si in said silicon nitride film is 1.2 to 1.4.

8. A method of manufacturing a semiconductor device according to claim 1, wherein said semiconductor film is formed by crystallizing an amorphous semiconductor film which is intentionally introduced a metallic element for promoting crystallization by performing a heat treatment.

9. A method of manufacturing a semiconductor device according to claim 1, wherein said semiconductor film is formed by crystallizing an amorphous semiconductor film which is selectively introducing a metallic element for promoting crystallization by performing a heat treatment.

10. A method of manufacturing a semiconductor device according to claim 1, wherein the impurity element is a metallic element selected from the group consisting of nickel, iron, cobalt, ruthenium, rhodium, palladium, osmium, iridium, platinum, copper and gold.

11. A method of manufacturing a semiconductor device, wherein after a material is formed in contact with a semiconductor film that is formed on a substrate, heat treatment is performed to thereby set a tensile stress of said material to 8×10$^9$ dynes/cm$^2$ or more and at the same time an impurity element in said semiconductor film is gettered into said material.

12. A method of manufacturing a semiconductor device according to claim 11, wherein the temperature of said heat treatment is 500 to 1000° C.

13. A method of manufacturing a semiconductor device according to claim 11 or 12, wherein said heat treatment is performed under an inert gas atmosphere.

14. A method of manufacturing a semiconductor device according to claim 13, wherein said inert gas is nitrogen.

15. A method of manufacturing a semiconductor device according to claim 11, wherein said heat treatment is performed under a pressure of 0.1 to 10 Torr.

16. A method of manufacturing a semiconductor device according to claim 11, wherein said material is a silicon nitride film, a silicon nitride oxide film, or a laminate film thereof.

17. A method of manufacturing a semiconductor device according to claim 16, wherein the composition ratio of N/Si in the silicon nitride film prior to said heat treatment is between 1.2 and 1.4.

18. A method of manufacturing a semiconductor device according to claim 16, wherein the composition ratio of N/Si in the silicon nitride film after said heat treatment is between 1.2 and 1.4.

19. A method of manufacturing a semiconductor device according to claim 11, wherein said material is formed by plasma CVD.

20. A method of manufacturing a semiconductor device according to claim 11, wherein said material is formed by sputtering.

21. A method of manufacturing a semiconductor device according to claim 11, wherein said semiconductor film is formed by crystallizing an amorphous semiconductor film which is intentionally introduced a metallic element for promoting crystallization by performing a heat treatment.

22. A method of manufacturing a semiconductor device according to claim 11, wherein said semiconductor film is formed by crystallizing an amorphous semiconductor film which is selectively introducing a metallic element for promoting crystallization by performing a heat treatment.

23. A method of manufacturing a semiconductor device comprising the steps of:
   forming a semiconductor film over a substrate;
   forming a material having a tensile stress of 8×10$^9$ dynes/cm$^2$ or more in contact with the semiconductor film, whereby an impurity element is gettered into the material;
   removing the material having a tensile stress of 8×10$^9$ dynes/cm$^2$ or more from the semiconductor film;
   forming a gate insulating film over the semiconductor film;
   forming a gate electrode over the gate insulating film.

24. A method of manufacturing a semiconductor device according to claim 23, wherein said material is formed by LPCVD within a temperature range of between 500 and 900° C.

25. A method of manufacturing a semiconductor device according to claim 23, wherein said material is formed by LPCVD within a pressure range of between 0.1 and 3 Torr.

26. A method of manufacturing a semiconductor device according to claim 23, wherein said material is formed by LPCVD with a gas containing chorine as a material gas.

27. A method of manufacturing a semiconductor device according to claim 23, wherein said material is a silicon nitride film formed by LPCVD.

28. A method of manufacturing a semiconductor device according to claim 27, wherein a composition ratio of N/Si in said silicon nitride film is 1.2 to 1.4.

29. A method of manufacturing a semiconductor device according to claim 23, wherein the impurity element is a metallic element selected from the group consisting of nickel, iron, cobalt, ruthenium, rhodium, palladium, osmium, iridium, platinum, copper and gold.

* * * * *